(12) United States Patent
Havens et al.

(10) Patent No.: US 7,055,747 B2
(45) Date of Patent: Jun. 6, 2006

(54) LONG RANGE OPTICAL READER

(75) Inventors: William H. Havens, Marcellus, NY (US); Robert J. Hennick, Auburn, NY (US); John Izzo, Auburn, NY (US); Michael Robinson, Weedsport, NY (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 0 days.

(21) Appl. No.: 10/252,484

(22) Filed: Sep. 23, 2002

(65) Prior Publication Data

US 2003/0226895 A1 Dec. 11, 2003

Related U.S. Application Data

(60) Provisional application No. 60/387,842, filed on Jun. 11, 2002.

(51) Int. Cl.
G02B 26/08 (2006.01)
(52) U.S. Cl. .................................. 235/462.22
(58) Field of Classification Search ........... 235/462.01, 235/462.09, 462.22, 462.23, 462.25, 462.42, 235/462.43
See application file for complete search history.

(56) References Cited

U.S. PATENT DOCUMENTS

| | | | |
|---|---|---|---|
| 3,978,317 A | 8/1976 | Yamaguchi et al. | |
| RE29,194 E | 4/1977 | Ambrose et al. | |
| 4,057,784 A | 11/1977 | Tafoya | |
| 4,085,423 A | 4/1978 | Tsunoda et al. | |
| 4,542,528 A | 9/1985 | Sanner et al. | |
| 4,721,849 A | 1/1988 | Davis et al. | |
| 4,758,717 A | 7/1988 | Shepard et al. | |
| 4,760,248 A | 7/1988 | Swartz et al. | |
| 4,774,715 A | 9/1988 | Messenger | |
| 4,818,847 A | 4/1989 | Hara et al. | |
| 4,841,132 A | 6/1989 | Kajitani et al. | |
| 4,847,490 A | 7/1989 | Nishikama | |
| 4,866,257 A | 9/1989 | Elliott et al. | |
| 4,877,949 A | 10/1989 | Danielson et al. | |
| 4,900,907 A | 2/1990 | Matusima et al. | |
| 4,918,297 A | 4/1990 | Kurimoto | |
| 4,920,255 A | 4/1990 | Gabeler | |
| 4,945,216 A | 7/1990 | Tanabe et al. | |
| 4,964,167 A | 10/1990 | Kunizawa et al. | |
| 5,010,241 A | 4/1991 | Butterworth | |
| 5,019,699 A | 5/1991 | Koenck | |

(Continued)

FOREIGN PATENT DOCUMENTS

DE 12 33 038 B 1/1967

(Continued)

OTHER PUBLICATIONS

U.S. Appl. No. 10/782,569, filed Feb. 19, 2004, Havens et al.

(Continued)

Primary Examiner—Ahshik Kim
(74) Attorney, Agent, or Firm—Wall Marjama & Bilinski LLP

(57) ABSTRACT

An indicia decoding device can have an image sensor and a laser diode assembly configured to project laser light onto a substrate. When a trigger signal is received by the indicia decoding device, the device can calculate a delay and enable the laser diode assembly if a delay threshold is satisfied. The indicia decoding device, in one embodiment, can include a hand held housing and an imaging module carrying the image sensor.

50 Claims, 17 Drawing Sheets

U.S. PATENT DOCUMENTS

| | | |
|---|---|---|
| 5,034,619 A | 7/1991 | Hammond, Jr. |
| 5,046,066 A | 9/1991 | Messenger |
| 5,059,778 A | 10/1991 | Zouzoulas et al. |
| 5,059,779 A | 10/1991 | Krichever |
| 5,101,406 A | 3/1992 | Messenger |
| 5,132,525 A | 7/1992 | Swartz |
| 5,149,948 A | 9/1992 | Chisholm |
| 5,157,248 A | 10/1992 | Barkan |
| 5,177,346 A | 1/1993 | Chisholm |
| 5,206,881 A | 4/1993 | Messenger et al. |
| 5,208,449 A | 5/1993 | Eastman et al. |
| 5,233,171 A | 8/1993 | Baldwin |
| 5,235,167 A | 8/1993 | Dvorkis et al. |
| 5,280,161 A | 1/1994 | Niwa |
| 5,280,164 A | 1/1994 | Barkan |
| 5,286,960 A | 2/1994 | Longacre, Jr. et al. |
| 5,291,008 A | 3/1994 | Havens et al. |
| 5,294,783 A | 3/1994 | Hammond, Jr. et al. |
| 5,296,689 A | 3/1994 | Redderson et al. |
| 5,308,962 A | 5/1994 | Havens et al. |
| 5,317,136 A | 5/1994 | Hasegawa et al. |
| 5,319,182 A | 6/1994 | Havens et al. |
| 5,331,176 A | 7/1994 | Sant Anselmo |
| 5,340,971 A | 8/1994 | Rockstein et al. |
| 5,340,972 A | 8/1994 | Sandor |
| 5,347,113 A | 9/1994 | Redderson et al. |
| 5,347,114 A * | 9/1994 | Tanaka .................. 235/462.07 |
| 5,354,977 A | 10/1994 | Roustaei |
| 5,378,883 A * | 1/1995 | Batterman et al. ..... 235/462.21 |
| 5,389,917 A | 2/1995 | LaManna et al. |
| 5,396,054 A | 3/1995 | Krichever et al. |
| 5,404,002 A | 4/1995 | Tang |
| 5,406,063 A | 4/1995 | Jelen |
| 5,410,141 A | 4/1995 | Koenck et al. |
| 5,420,411 A | 5/1995 | Salatto, Jr. et al. |
| 5,430,286 A | 7/1995 | Hammond, Jr. et al. |
| 5,440,111 A | 8/1995 | Eastman et al. |
| 5,449,892 A | 9/1995 | Yamada |
| 5,473,149 A | 12/1995 | Miwa et al. |
| 5,504,316 A | 4/1996 | Bridgelall |
| 5,504,317 A | 4/1996 | Takahashi |
| 5,504,367 A | 4/1996 | Arackellian et al. |
| 5,510,606 A | 4/1996 | Worthington et al. |
| 5,532,692 A | 7/1996 | Tatsuya |
| 5,534,684 A * | 7/1996 | Danielson .............. 235/472.02 |
| 5,541,419 A | 7/1996 | Arackellian |
| 5,550,364 A | 8/1996 | Rudeen |
| 5,550,367 A | 8/1996 | Plesko |
| 5,557,095 A | 9/1996 | Clark et al. |
| 5,576,529 A | 11/1996 | Koenck et al. |
| 5,579,487 A | 11/1996 | Meyerson et al. |
| 5,585,616 A | 12/1996 | Roxby |
| 5,591,955 A | 1/1997 | Laser |
| 5,597,997 A | 1/1997 | Obata et al. |
| 5,598,007 A | 1/1997 | Bunce et al. |
| 5,602,376 A | 2/1997 | Coleman et al. |
| 5,610,595 A | 3/1997 | Garrabrant et al. |
| 5,612,530 A * | 3/1997 | Sanders et al. ........ 235/462.48 |
| 5,623,137 A | 4/1997 | Powers et al. |
| 5,637,854 A | 6/1997 | Thomas |
| 5,638,115 A | 6/1997 | Imai |
| 5,640,001 A | 6/1997 | Danielson et al. |
| 5,640,684 A | 6/1997 | Konosu et al. |
| 5,644,601 A | 7/1997 | Kawaguchi |
| 5,646,389 A | 7/1997 | Bravman et al. |
| 5,648,650 A | 7/1997 | Sugifune et al. |
| 5,668,803 A | 9/1997 | Tymes et al. |
| 5,672,858 A | 9/1997 | Li et al. |
| 5,684,104 A | 11/1997 | Funk et al. |
| 5,684,290 A | 11/1997 | Arackellian et al. |
| 5,696,607 A | 12/1997 | Yamana et al. |
| 5,697,699 A | 12/1997 | Seo et al. |
| 5,703,349 A | 12/1997 | Meyerson et al. |
| 5,714,745 A | 2/1998 | Ju et al. |
| 5,714,746 A * | 2/1998 | Dvorkis et al. ........ 235/462.45 |
| 5,717,195 A | 2/1998 | Feng et al. |
| 5,717,221 A | 2/1998 | Li et al. |
| 5,723,868 A | 3/1998 | Hammond, Jr. et al. |
| 5,734,153 A | 3/1998 | Swartz et al. |
| 5,736,726 A | 4/1998 | VanHorn et al. |
| 5,743,633 A | 4/1998 | Chau et al. |
| 5,744,788 A | 4/1998 | Metlitsky et al. |
| 5,744,815 A | 4/1998 | Gurevich et al. |
| 5,745,176 A | 4/1998 | Lebens |
| 5,754,587 A | 5/1998 | Kawaguchi |
| 5,756,981 A | 5/1998 | Roustaei et al. |
| 5,763,864 A | 6/1998 | OHagan et al. |
| 5,773,810 A | 6/1998 | Hussey et al. |
| 5,777,743 A | 7/1998 | Bacchi et al. |
| 5,780,834 A | 7/1998 | Havens et al. |
| 5,783,811 A | 7/1998 | Feng et al. |
| 5,784,102 A | 7/1998 | Hussey et al. |
| 5,786,586 A | 7/1998 | Pidhirny et al. |
| 5,793,903 A | 8/1998 | Lopresti et al. |
| 5,794,145 A | 8/1998 | Milam |
| 5,801,371 A | 9/1998 | Kahn et al. |
| 5,802,179 A | 9/1998 | Yamamoto |
| 5,804,802 A | 9/1998 | Card et al. |
| 5,804,809 A | 9/1998 | Eastman et al. |
| 5,811,784 A | 9/1998 | Tausch et al. |
| 5,814,827 A | 9/1998 | Katz |
| 5,815,811 A | 9/1998 | Pinard et al. |
| 5,818,528 A | 10/1998 | Roth et al. |
| 5,821,518 A | 10/1998 | Sussmeier et al. |
| 5,825,006 A | 10/1998 | Longacre, Jr. et al. |
| 5,834,749 A | 11/1998 | Durbin |
| 5,834,754 A | 11/1998 | Feng et al. |
| 5,837,986 A | 11/1998 | Barile et al. |
| 5,838,720 A | 11/1998 | Morelli |
| 5,841,121 A | 11/1998 | Koenck |
| 5,848,064 A | 12/1998 | Cowan |
| 5,850,078 A | 12/1998 | Giordano et al. |
| 5,859,417 A | 1/1999 | Dvorkis et al. |
| 5,859,970 A | 1/1999 | Pleso |
| 5,872,354 A | 2/1999 | Hanson |
| 5,877,487 A | 3/1999 | Tani et al. |
| 5,880,452 A | 3/1999 | Plesko |
| 5,886,338 A | 3/1999 | Arackellian et al. |
| 5,894,348 A | 4/1999 | Bacchi et al. |
| 5,905,251 A | 5/1999 | Knowles |
| 5,912,921 A | 6/1999 | Warren et al. |
| 5,914,478 A | 6/1999 | Bridgelall |
| 5,920,061 A | 7/1999 | Feng |
| 5,924,040 A | 7/1999 | Trompower |
| 5,929,418 A | 7/1999 | Ehrhart et al. |
| 5,932,139 A | 8/1999 | Oshima et al. |
| 5,932,862 A | 8/1999 | Hussey et al. |
| 5,942,762 A | 8/1999 | Hecht |
| 5,945,660 A | 8/1999 | Nakasuji et al. |
| 5,946,344 A | 8/1999 | Warren et al. |
| 5,949,054 A | 9/1999 | Karpen et al. |
| 5,949,056 A * | 9/1999 | White .................. 235/472.01 |
| 5,949,057 A | 9/1999 | Feng |
| 5,955,720 A | 9/1999 | He et al. |
| 5,962,836 A | 10/1999 | Tani et al. |
| 5,965,863 A | 10/1999 | Parker et al. |
| 5,973,681 A | 10/1999 | Tanigawa et al. |
| 5,975,419 A | 11/1999 | Dickson et al. |
| 5,984,188 A | 11/1999 | Dvorkis et al. |
| 5,988,506 A | 11/1999 | Schaham et al. |
| 5,992,744 A | 11/1999 | Smith et al. |
| 5,992,746 A | 11/1999 | Suzuki |
| 6,019,286 A | 2/2000 | Li et al. |
| 6,027,024 A | 2/2000 | Knowles |

| | | |
|---|---|---|
| 6,029,893 A | 2/2000 | Tan et al. |
| 6,034,379 A | 3/2000 | Bunte et al. |
| 6,039,255 A | 3/2000 | Seo |
| 6,045,047 A | 4/2000 | Pidhirny et al. |
| 6,045,048 A | 4/2000 | Wilz, Sr. et al. |
| 6,052,236 A | 4/2000 | Nakasuji et al. |
| 6,053,408 A | 4/2000 | Stoner |
| 6,060,722 A | 5/2000 | Havens et al. |
| 6,062,475 A | 5/2000 | Feng |
| 6,066,857 A | 5/2000 | Fantone et al. |
| 6,068,188 A | 5/2000 | Knowles |
| 6,072,401 A | 6/2000 | Kumar |
| 6,092,728 A | 7/2000 | Li et al. |
| 6,098,887 A | 8/2000 | Figarella et al. |
| 6,119,939 A | 9/2000 | Schwartz et al. |
| 6,119,944 A | 9/2000 | Mulla et al. |
| 6,123,261 A | 9/2000 | Roustaei |
| 6,123,263 A | 9/2000 | Feng |
| 6,123,264 A | 9/2000 | Li et al. |
| 6,129,283 A | 10/2000 | Imade et al. |
| 6,141,046 A | 10/2000 | Roth et al. |
| 6,147,358 A | 11/2000 | Hecht |
| 6,152,371 A | 11/2000 | Schwartz et al. |
| 6,164,544 A | 12/2000 | Schwartz et al. |
| 6,178,426 B1 | 1/2001 | Klein et al. |
| 6,179,208 B1 | 1/2001 | Feng |
| 6,182,897 B1 | 2/2001 | Knowles et al. |
| 6,199,044 B1 | 3/2001 | Ackley et al. |
| 6,213,397 B1 | 4/2001 | Rando |
| 6,223,988 B1 | 5/2001 | Batterman et al. |
| 6,283,374 B1 | 9/2001 | Fantone et al. |
| 6,303,929 B1 | 10/2001 | Oshima et al. |
| 6,318,635 B1 | 11/2001 | Stoner |
| 6,318,637 B1 | 11/2001 | Stoner |
| 6,321,989 B1 | 11/2001 | Wilz, Sr. et al. |
| 6,321,991 B1 | 11/2001 | Knowles |
| 6,321,992 B1 | 11/2001 | Knowles et al. |
| 6,323,503 B1 | 11/2001 | Hecht |
| 6,325,289 B1 | 12/2001 | Mazzone |
| 6,330,973 B1 | 12/2001 | Bridgelall et al. |
| 6,340,114 B1 | 1/2002 | Correa et al. |
| 6,345,764 B1 | 2/2002 | Knowles |
| 6,347,163 B1 | 2/2002 | Roustaei |
| 6,347,743 B1 | 2/2002 | Wilz, Sr. et al. |
| 6,352,204 B1 | 3/2002 | Hattersley et al. |
| 6,352,517 B1 | 3/2002 | Flock et al. |
| 6,360,949 B1 | 3/2002 | Shepard et al. |
| 6,371,374 B1 | 4/2002 | Schwartz et al. |
| 6,375,074 B1 | 4/2002 | Dickson et al. |
| 6,389,010 B1 | 5/2002 | Kubler et al. |
| 6,398,112 B1 | 6/2002 | Li et al. |
| 6,412,699 B1 | 7/2002 | Russell et al. |
| 6,431,452 B1 | 8/2002 | Feng |
| 6,439,462 B1 | 8/2002 | Dickson et al. |
| 6,507,864 B1 | 1/2003 | Klein et al. |
| 6,535,493 B1 | 3/2003 | Lee et al. |
| 6,539,360 B1 | 3/2003 | Kadaba |
| 6,539,422 B1 | 3/2003 | Hunt et al. |
| 6,540,140 B1 | 4/2003 | Knowles et al. |
| 6,547,139 B1 | 4/2003 | Havens et al. |
| 6,578,767 B1 | 6/2003 | Barkan et al. |
| 6,595,422 B1 | 7/2003 | Dolijack |
| 6,601,768 B1 | 8/2003 | McCall et al. |
| 6,607,128 B1 | 8/2003 | Schwartz et al. |
| 6,629,641 B1 | 10/2003 | Tsikos et al. |
| 6,661,521 B1 | 12/2003 | Stern |
| 6,681,994 B1 | 1/2004 | Koenck |
| 6,688,523 B1 | 2/2004 | Koenck |
| 6,732,929 B1 | 5/2004 | Good et al. |
| 6,786,414 B1 | 9/2004 | Tsikos et al. |
| 6,808,114 B1 | 10/2004 | Palestini et al. |
| 6,817,525 B1 | 11/2004 | Piva et al. |
| 6,830,184 B1 | 12/2004 | Au et al. |
| 6,837,437 B1 | 1/2005 | Tsikos et al. |
| 6,843,417 B1 | 1/2005 | Philyaw et al. |
| 2001/0043273 A1 | 11/2001 | Herrod et al. |
| 2001/0055422 A1 | 12/2001 | Roustaei |
| 2002/0039033 A1 | 4/2002 | Harper |
| 2002/0039099 A1 | 4/2002 | Harper |
| 2002/0066788 A1 | 6/2002 | Knowles |
| 2003/0222147 A1 | 12/2003 | Havens et al. |
| 2003/0226895 A1 | 12/2003 | Havens et al. |
| 2004/0020990 A1 | 2/2004 | Havens et al. |
| 2004/0031851 A1 | 2/2004 | Bianculli et al. |
| 2004/0035933 A1 | 2/2004 | Havens et al. |

FOREIGN PATENT DOCUMENTS

| | | |
|---|---|---|
| DE | 12 40 149 B | 5/1967 |
| EP | 0 516 927 A | 12/1992 |
| EP | 0 910 032 A2 | 4/1998 |
| EP | 0 974 924 A | 1/2000 |
| EP | 0 999 514 A1 | 5/2000 |
| EP | 0999514 A1 | 5/2000 |
| EP | 1 079 466 A | 2/2001 |
| EP | 1 128 315 A1 | 8/2001 |
| EP | 1128315 | 8/2001 |
| EP | 0 690 404 B1 | 9/2001 |
| EP | 0690404 | 9/2001 |
| EP | 0 818 750 B1 | 11/2001 |
| EP | 0818750 | 11/2001 |
| GB | 2 128 549 A | 5/1984 |
| JP | 03228193 A | 10/1991 |
| JP | 4 330583 A2 | 11/1992 |
| JP | 4330583 | 11/1992 |
| JP | 04333187 A | 11/1992 |
| WO | WO 97/08647 | 3/1997 |
| WO | WO 01/26036 A2 | 4/2001 |
| WO | WO 02/073953 A2 | 9/2002 |

OTHER PUBLICATIONS

International Search Report for International Application No. PCT/US02/07161 dated Dec. 20, 2002.

International Search Report for International Application No. PCT/US03/17564 dated Sep. 18, 2003.

International Search Report for International Patent Application No. PCT/US03/18557 dated Feb. 25, 2004.

John H. Day; Optical ICs look to enterprise-metro link; Electronic Engineering Times; Apr., 2002; 6 pgs.; http://www.eet.com/story/OEG20020418S0065.

* cited by examiner

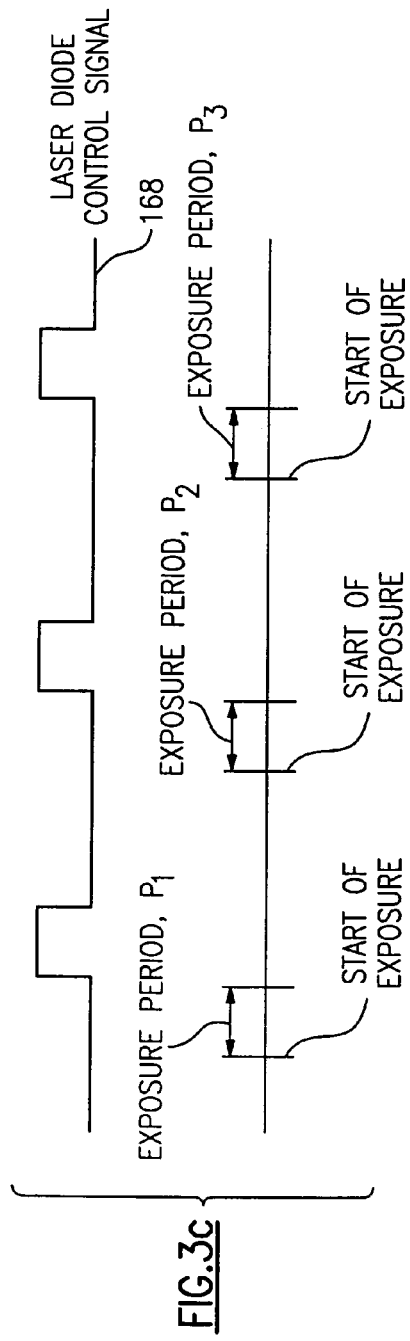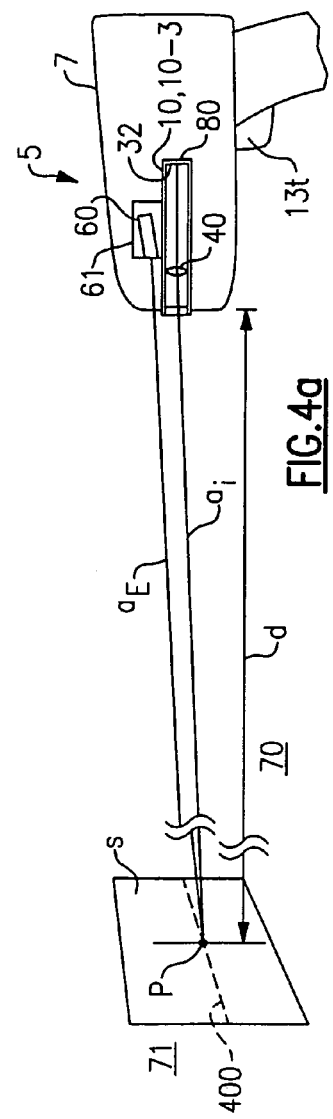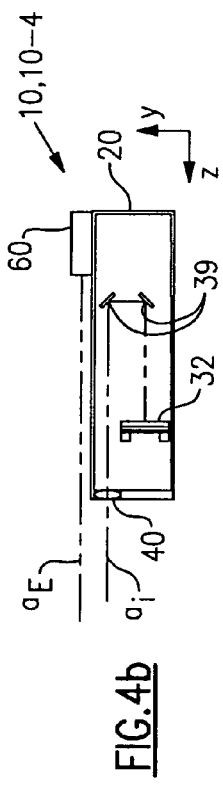

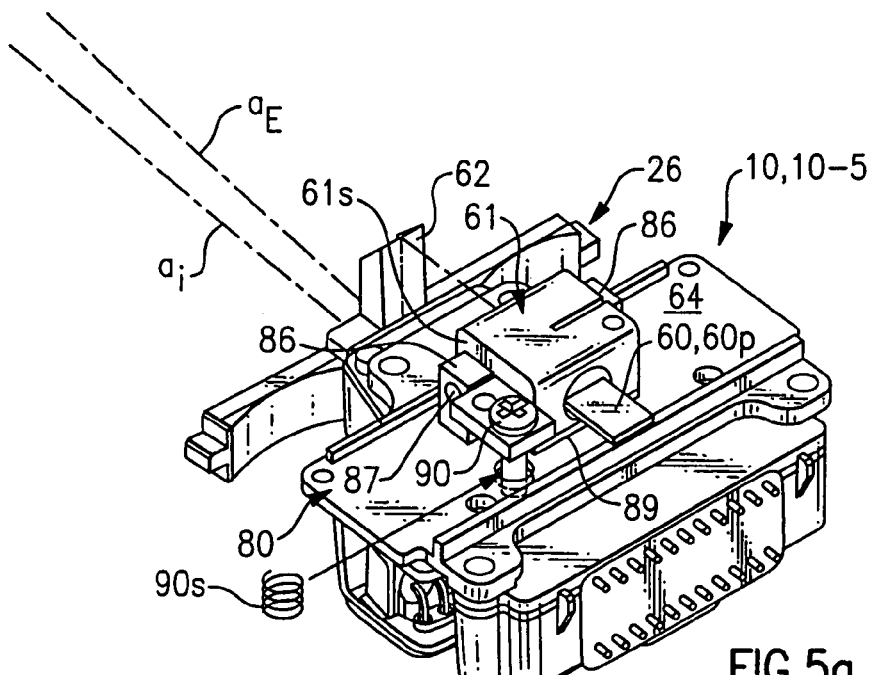
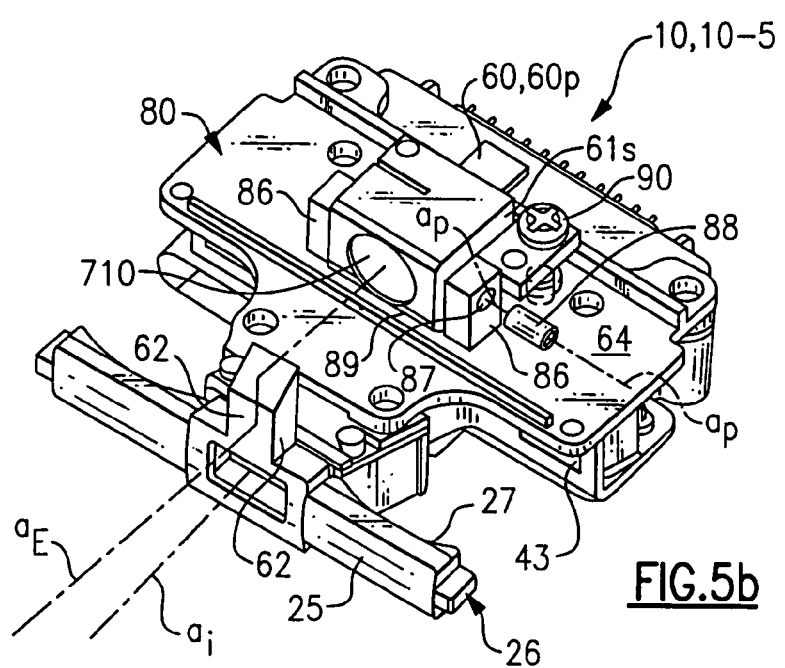

LONG RANGE OPTICAL READER

CROSS REFERENCE TO RELATED APPLICATIONS

This application claims the priority, under 35 U.S.C. § 119(e), of U.S. Provisional Application Ser. No. 60/387,842 filed Jun. 11, 2002, entitled "Long Range Optical Reader", which is incorporated herein by reference.

FIELD OF THE INVENTION

The invention relates to optical readers in general and particularly to optical readers adapted for long range reading of decodable indicia.

BACKGROUND OF THE PRIOR ART

Bar codes and other decodable indicia are finding increased use including in industrial applications wherein bar codes are to be read at long range reading distances such as beyond five feet. Presently available optical readers configured for such long range reading are laser scan engine based. In a laser scan engine based optical reader, a laser beam is swept across a target substrate by a delicately mounted moving mirror.

Unfortunately, problems have been noted with presently available laser scan engine based long range optical readers. At long range reading distances, scanning lines projected by a laser scan engine are difficult to read, making it difficult to locate a decodable indicia within a field of view of the reader. Furthermore, laser scan engine based readers are susceptible to breakdown. If a laser scan engine reader is dropped, the delicately mounted scanning mirror can easily become misaligned. The need for ruggedized bar code readers, which can withstand drops and other incidents of high impact is especially great in industrial applications wherein long range reading is often required.

There is a need for an optical reader including a targeting system which enables a reader to be readily aligned with a target indicia even at long range reading distances.

SUMMARY OF THE INVENTION

According to its major aspects and broadly stated, the invention is a long range image sensor based optical reader.

In one aspect of the invention, in one embodiment, an optical reader includes an imaging module having a support assembly carrying an image sensor and imaging optics, wherein the imaging optics are selected so that a best receive optic focus position of the reader is at a long range such as more than about five feet.

In another aspect of the invention, in one embodiment, the reader includes a targeting system so that the target indicia can readily be spotted at long range reading distances. The targeting system can comprise a laser diode assembly of the type comprising a laser diode and collimating optics. The targeting system can further include folding optics such as mirrors or prisms which redirect the light emanating from the laser diode assembly so that the targeting beam is directed along a path substantially parallel to and proximate an imaging axis. The targeting system can be incorporated in an imaging module mounted in a reader housing. In one specific embodiment precision mounting assembly for precision mounting of a laser diode assembly is disposed on a support assembly of a reader imaging module.

In a further aspect of the invention, the reader's illumination system can be adapted so that a signal strength of image signals generated at long range reading distances is enhanced. A signal strength (signal to noise ratio) of a long range reader can be enhanced by configuring the reader to have a best emit focus distance longer than a best receive optic focus distance.

In another aspect of the invention, an imaging assembly of a reader of the invention can include moving optics which allow adjustment of the best receive focus position of the reader, or a second complete imaging system adapted for reading at shorter reading distances.

These and other details and advantages will become apparent from the detailed description of the preferred embodiment hereinbelow.

BRIEF DESCRIPTION OF THE DRAWINGS

For a further understanding of these and objects of the invention, reference will be made to the following detailed description of the invention which is to be read in connection with the accompanying drawing, wherein:

FIG. 3c is a timing diagram illustrating an exemplary method of controlling a laser diode assembly according to the invention;

FIG. 4a is a side view schematic diagram of one type of optical reader according to the invention;

FIG. 4b is a side view schematic diagram of a type of imaging module according to the invention;

FIGS. 5a–5b are perspective views of a type of imaging module according to the invention;

DETAILED DESCRIPTION OF THE INVENTION

Figure 1:
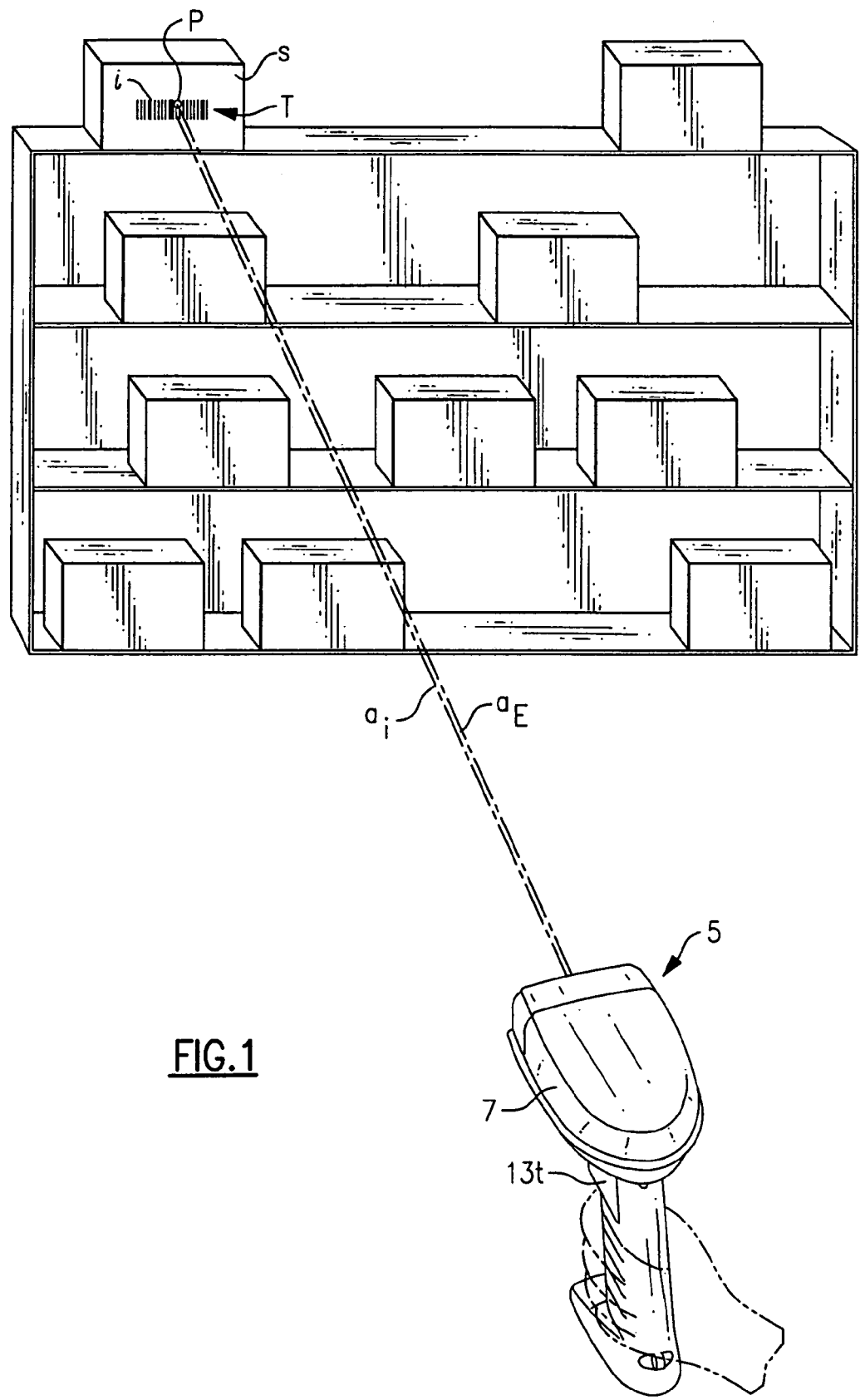
FIG. 1 is a schematic diagram of a long range optical reader in use in an industrial application.

An optical reader of the invention in use in an industrial application is shown in FIG. 1. Reader 5 is adapted for reading at very long range reading distances e.g. such as five feet or more. Typically, reader 5 is employed to read standard or "retro-reflective" bar codes. Retro-reflective bar codes, common in warehouse and factory applications, are formed on highly reflective surfaces such that a majority of incident light is reflected back to reader 5. As will be explained in greater detail herein, reader 5 includes imaging optics 40 (as seen e.g. in FIGS. 2b and 2e) which configure reader 5 so that reader 5 has a long range best-focus distance (e.g. more than 5 feet). Further, long range reader 5 typically includes a long range targeting assembly which is adapted so that a visible aiming pattern P (see FIGS. 7a–7h) is projected within or proximate a target, T, at a long reader-to-target distance. The term "target," T, herein refers to the space on an indicia-bearing substrate, s, which is presently in a field of view of reader 5. Indicia-bearing substrate, s, which bears a decodable character or symbol can be provided, for example by a piece of paper, an apparatus, an article of manufacture, a box, or a shipping container as is shown in the specific application view FIG. 1.

As explained in such copending applications as U.S. Ser. No. 09/658,811, filed Sep. 11, 2000, entitled "Optical Assembly for Barcode Scanner" and U.S. Ser. No. 10/092,789, filed Mar. 7, 2002, entitled "Optical Reader Imaging Module", an optical reader can include preassembled imaging modules carrying various optical emit and receive components, which can be modularly installed inside a reader housing. A "preassembled" imaging module is typically assembled as a self-contained multicomponent part unit as shown in e.g. FIGS. 2a–2e prior to being mounted in a reader housing. Long range reading imaging modules according to the invention are shown and described with reference to FIGS. 2a–2e.

Figure 2A:
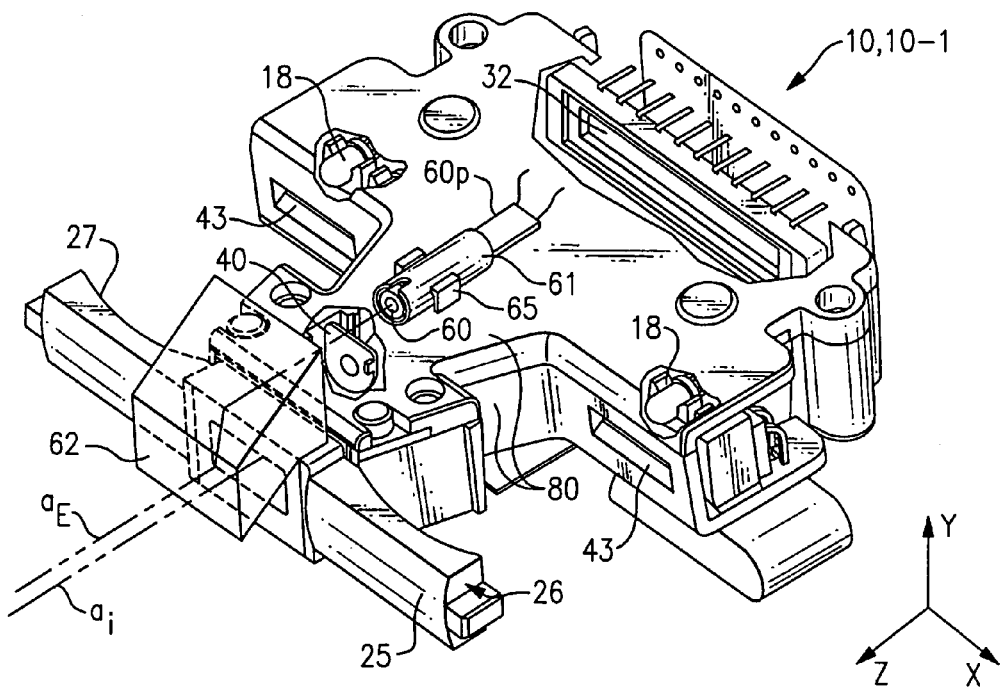
FIG. 2a is a perspective view of a first optical reader imaging module according to the invention.
Figure 2B:
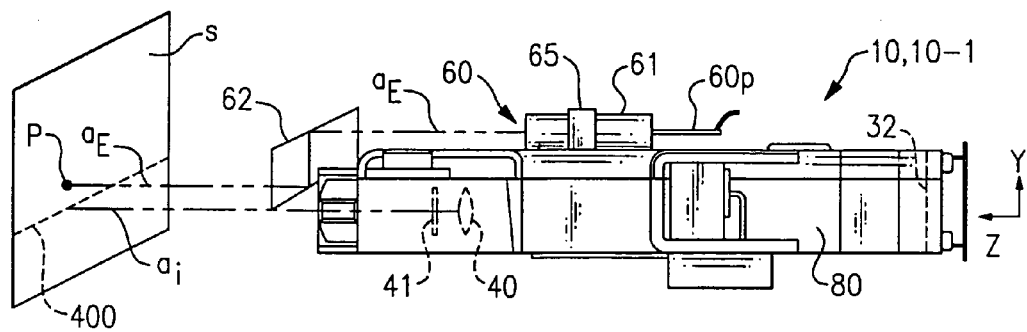
FIG. 2b is side view of a first optical reader imaging module according to the invention.

A first type of imaging module which may be incorporated in a housing 7 of reader 5 is shown in FIG. 2a. Imaging module 10, 10-1 includes a support assembly 80 which receives and supports various reader components. Supported on support assembly 80 are an imaging assembly including a plural photodetector image sensor 32 and imaging optics 40 for focusing target indicia onto image sensor 32. In the embodiment of FIGS. 2a and 2b, image sensor 32, is provided by a 1D photodetector array incorporated on an integrated circuit chip. However, as will be described in greater detail herein an imaging module according to the invention can also comprise a 2D image sensor.

Figure 2C:
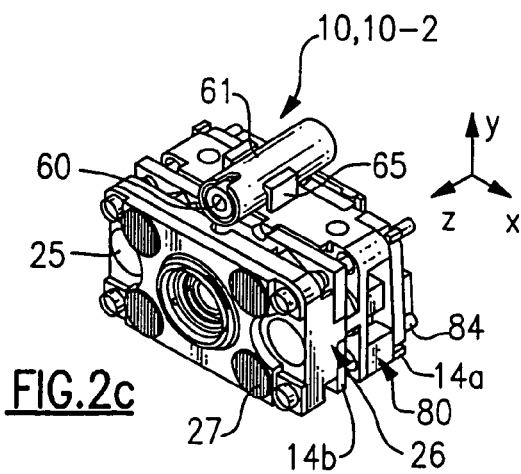
FIGS. 2c and 2d are perspective views of a second imaging module according to the invention.
Figure 2D:
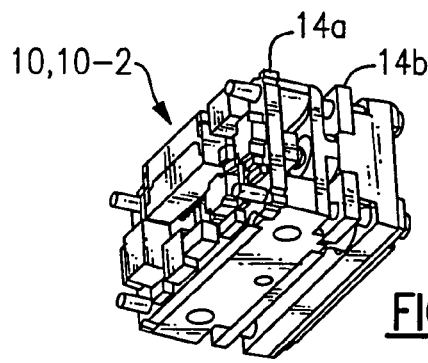
Figure 2E:
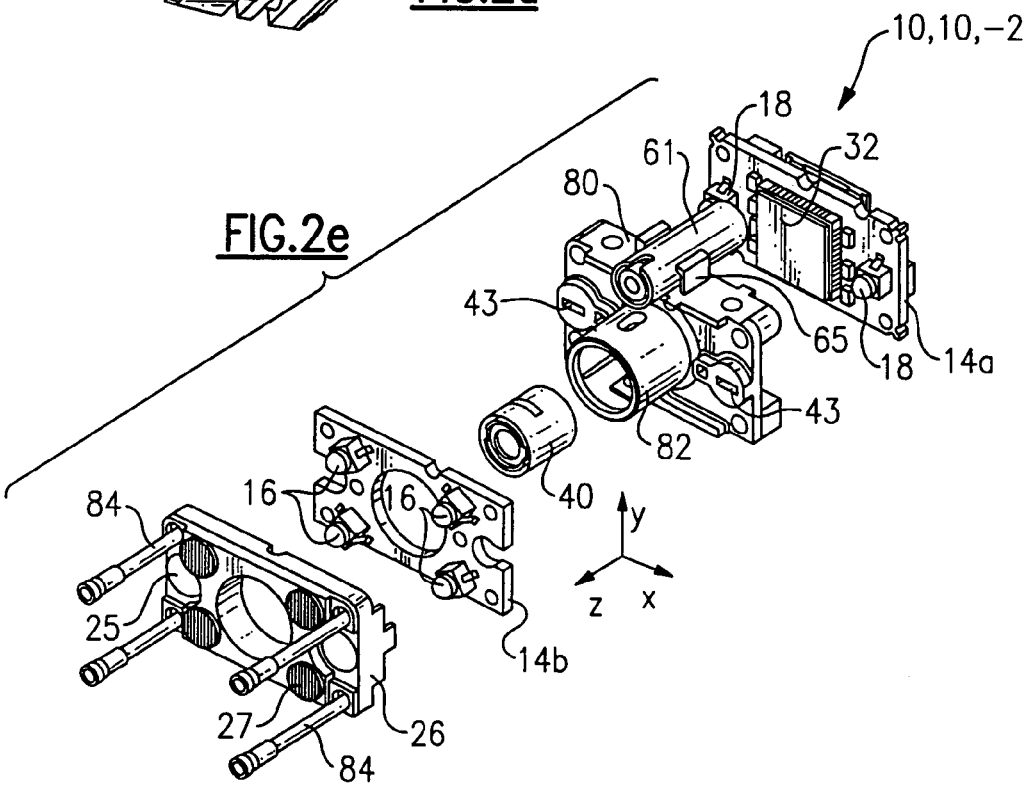
FIG. 2e is an assembly view of a second imaging module according to the invention.

Referring to further aspects of imaging optics 40, imaging optics 40 are adapted so that reader 5 has a best focus receive optic distance of greater than 5 feet. In one specific example of the invention, imaging optics 40 are adapted so that reader 5 has a best focus receive optic distance of 6.56 feet (2.0M). Imaging optics 40 can include e.g. a single element lens, a two element lens (lens doublet) or three element lens (lens triplet). In other specific embodiments, imaging optics 40 are adapted so that reader 5 has a best focus receive distances of 10 feet, 20 feet, and 30 feet. Optics 40 can comprise any suitable material e.g. glass or plastic. In the embodiment of FIGS. 2a and 2b imaging optics 40 are shown as being provided in an optical package known as a lens card. Optics 40 may also be packaged in an optical package known as a lens barrel as is shown in the embodiment of FIG. 2e to be described herein. Referring to further aspects of the imaging assembly including optics 40, the imaging assembly can include a vertical oriented slit aperture card 41 as explained in U.S. application Ser. No. 09/658,811, filed Sep. 11, 2000, entitled "Optical Assembly for Barcode Scanner," incorporated herein by reference.

Referring to further aspects of imaging module 10-1, module 10-1 further includes an illumination assembly comprising at least one LED and at least one laser diode assembly for projecting a long range aiming pattern. The illumination system of module 10-1 includes LEDs 18, apertures 43, and a lens member 26. Lens member 26 includes surfaces 27 formed on light entry surfaces of lens member 26 for horizontally spreading light from LEDs 18 and imaging lens surfaces 25 for imaging apertures 43 into target space, T. Alternative embodiments of illumination systems which may be incorporated in module 10-1 are described in U.S. Ser. No. 10/093,140, filed Mar. 7, 2002, entitled "Optical Reader Aiming Assembly Comprising Aperture," incorporated herein by reference. It is understood that apertures 43 can be deleted from the illumination system so that imaging lens surface 25 images LEDs 18 directly into target space without imaging apertures 43 in target space. It is also understood that LEDs 18 can be deleted altogether or disabled if ambient light is sufficient.

Figure 9A:
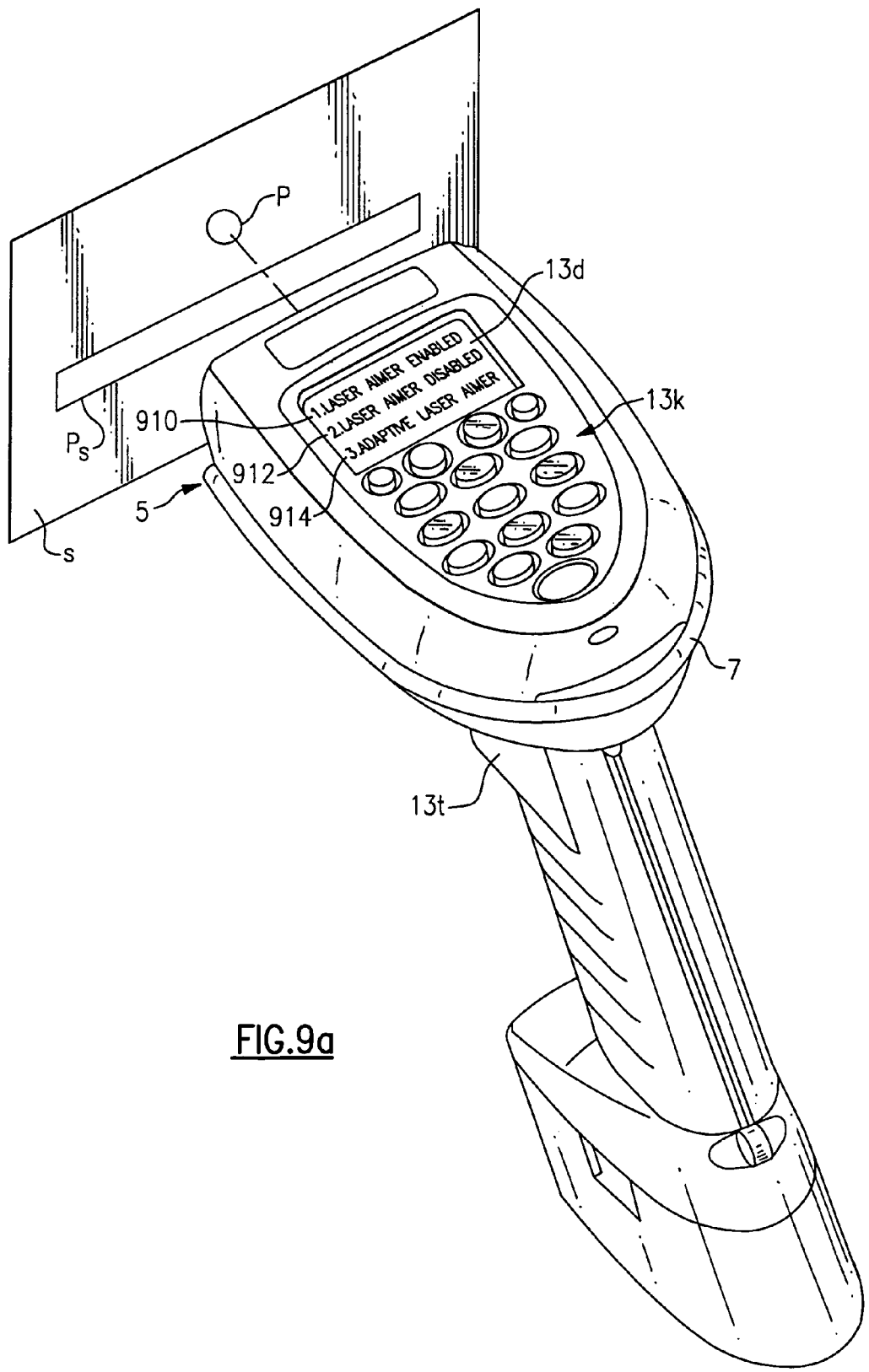
FIG. 9a is a perspective view of an optical reader according to the invention.

At long range reading distances, such as beyond five feet, light from LEDs 18, projecting a "short range" aiming pattern $P_s$ (as seen in FIG. 9a), may not be highly visible and may not be highly useful in aiding the alignment of reader 5 relative to a target, T. Also, substantial ambient light may diminish a visibility of an aiming pattern projected by aiming LEDs 18. Accordingly, an illumination assembly of module 10-1 may include a targeting system which is adapted to project a long range aiming pattern P onto a target T such that the long range aiming pattern P is visible at long range distances (e.g. beyond 5 feet). According to the invention, long range aiming pattern P is normally more visible than a short range aiming pattern Ps, particularly at longer range reading distances.

Configuring reader 5 so that a long range aiming pattern P is projected on or about an indicia to be read increases the likelihood that a field of view of reader 5 coincides with a symbol or character to be read. In a further aspect of the invention, it is useful to configure emit optics e.g. 25 so that a best focus emit distance of reader 5, at which an image of aperture 43 is optimally focused on a target substrate is at least as long as the best focus receive distance. For example, if a best focus receive distance of reader 5 is 20 feet, reader 5 is advantageously adapted so that a best focus emit distance of reader 5 is at least 20 feet. Configuring reader 5 so that reader 5 has a best focus emit distance of at least as long as a best focus receive distance increases a strength of image information electronic signals output by image sensor 32.

Figure 6A:
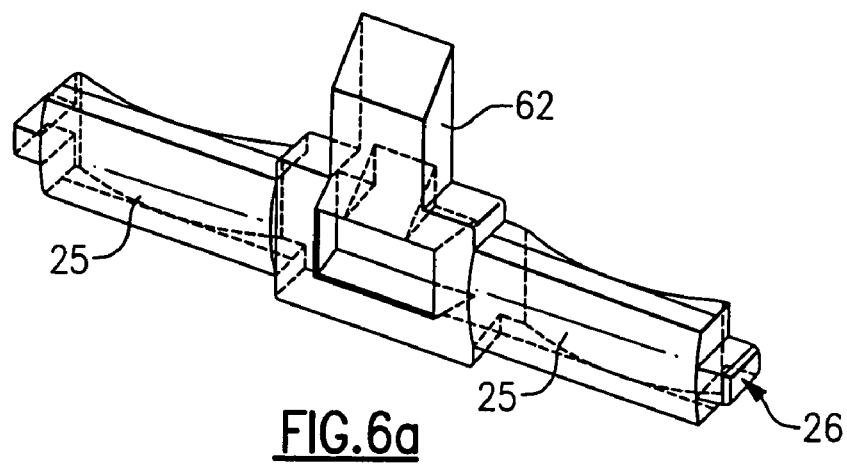
FIGS. 6a–6b are perspective view of an embodiment of an optical member according to the invention having aiming optics, including a prism.
Figure 6B:
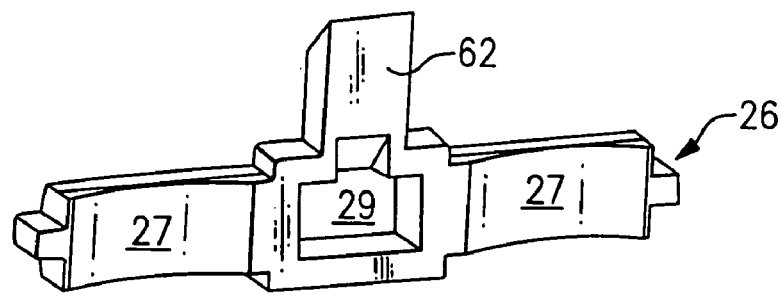
Figure 6C:
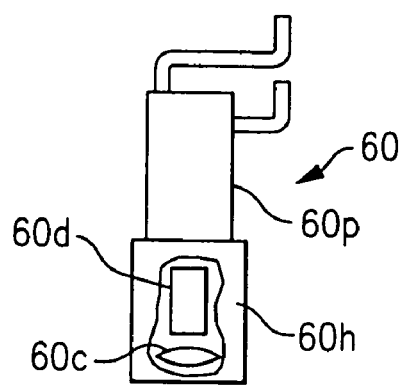
FIG. 6c is a schematic view of a laser diode assembly.

Referring to features of the targeting system of module 10-1 in further detail, the targeting system of module 10-1 includes a laser diode assembly 60 of the type including a laser diode and collimating optics. Laser diode assembly 60 may be e.g. a Model LM-761-A1 laser diode assembly of the type available from Excel Scientech Co. of Taiwan as is shown in FIG. 6c. As seen in FIG. 6c, exemplary laser diode assembly 60 includes a PCB 60p supporting laser diode 60d, and collimating optics 60c housed within a diode assembly housing 60h. In module 10-1 shown in FIGS. 2a and 2b laser diode assembly 60 is disposed within protective holder 61 which houses assembly 60. Protective holder 61 housing and supporting laser diode assembly 60 is disposed in clips 65 of module 10-1, the clips integrally formed on support assembly 80. Clips 65 support holder 61 and assembly 60 in a certain position relative to support assembly 80.

An exemplary 2D imaging module according to the invention including a long range targeting optic system 60, 61, and 65 is described with reference to FIGS. 2c, 2d, and 2e. Imaging module 10, 10-2 as shown in FIGS. 2c, 2d, and 2e includes a support assembly 80 having an image sensor containment section and an imaging optic retainer section 82, a first circuit board 14a carrying a plural photodetector image sensor 32 and aiming LEDs 18, a second circuit board 14b carrying illumination LEDs 16, an optical member 26 carrying aiming and illumination optics 25, 27, and support posts 84 holding the various components of the module together. Further details of imaging module 10-2 are described in application Ser. No. 10/092,789, filed Mar. 7, 2002, entitled "Optical Reader Imaging Module," incorporated herein by reference. In accordance with the invention, imaging module 10-2 further includes laser diode assembly 60, as described previously. Laser diode assembly 60 as in module 10-1, may be installed in holder 61, which in turn is disposed in clips 65 formed on assembly 80. Disposing holder 61 in clips 65 securely positions assembly 60 in a certain position relative to support assembly 80.

Laser diode assembly 60 in any of the embodiments shown can be replaced with another light assembly suitable for producing a visible light pattern at long range reading distances. For example, laser diode assembly 60 can be replaced with a light assembly comprising an LED in combination with collimating optics for collimating light from the LED.

Electrical block diagrams illustrating operations of electrical circuits for control of a long range reader according to the invention are now described with reference to FIGS. 3a and 3b. An electrical circuit 100 for controlling operation of a 2D long range imaging module e.g. module 10-2 is described generally with reference to FIG. 3a. An electrical circuit 101 for controlling operation of a 1D long range imaging module e.g. module 10-1 is described generally with reference to FIG. 3b.

Figure 3A:
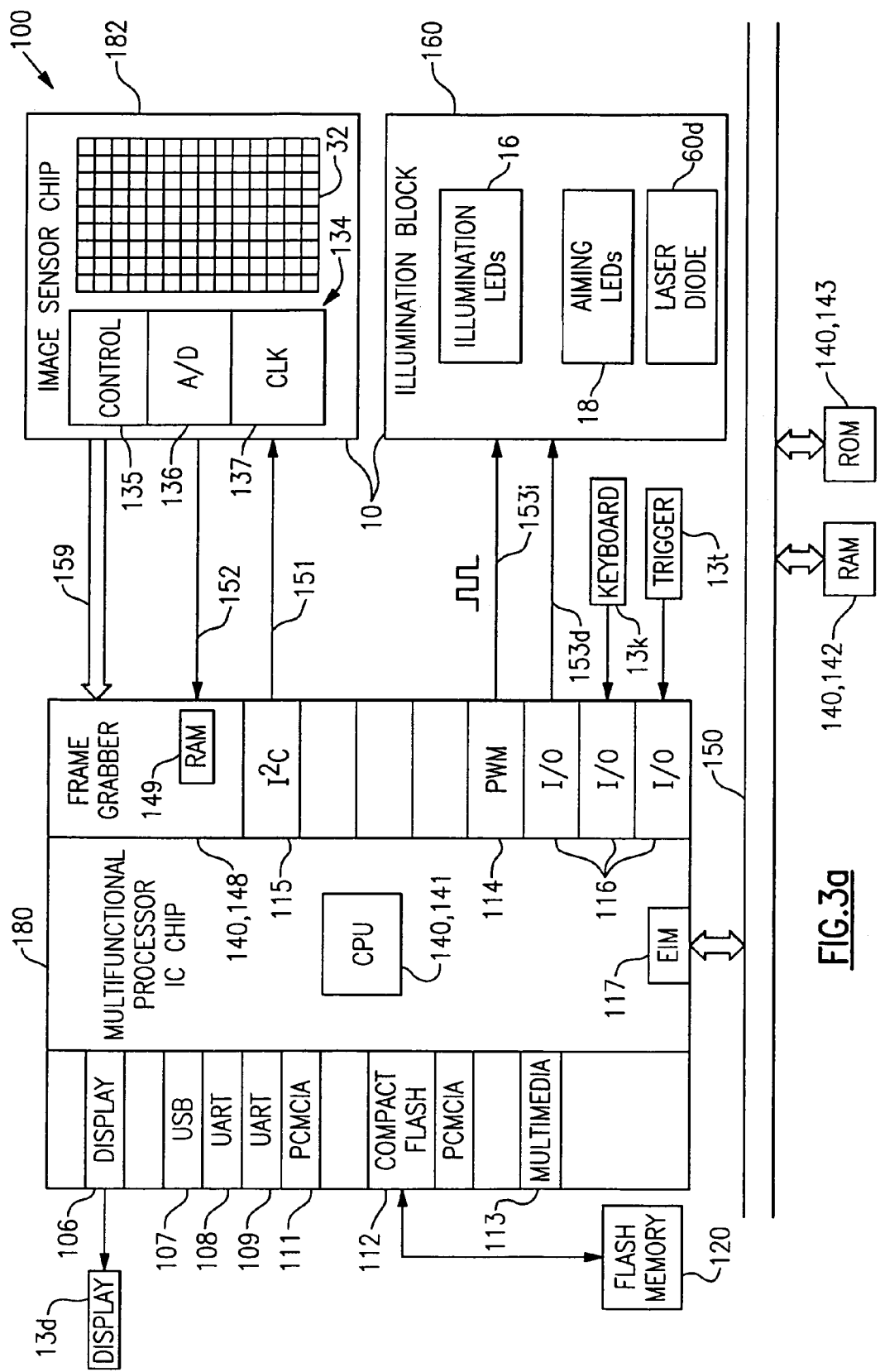
FIGS. 3a and 3b are block electrical diagrams of optical readers according to the invention.

In the specific embodiment of FIG. 3a, electrical circuit 100 includes a control circuit 140 comprising CPU 141, system RAM 142 and system ROM 143 and frame grabber block 148. Electrical circuit 100 further includes an image sensor 32 typically provided by a photosensitive array and an illumination block 160 having illumination LEDs 16 aiming LEDs 18 and laser diode 60d of a laser diode assembly 60 as shown in the physical form view of FIGS. 2c–2e. Image sensor 32 of FIG. 3a is shown as being provided by a 2D photo diode array. If image sensor 32 is replaced by a 1D image sensor, then aiming LEDs 18 and illumination LEDs 16 may be constituted by one set of LEDs. In the embodiment shown, image sensor 32 incorporated in an image sensor IC chip 182 typically further includes an image sensor electrical circuit block 134. Image sensor electrical block 134 includes control circuit 135 for controlling image sensor 32, and A/D conversion circuit 136, for converting analog signals received from image sensor into digital form and integrated clock 137 sometimes referred to as an oscillator.

In the embodiment shown in FIG. 3a, CPU 141 and frame grabber block 148 are incorporated in a multifunctional IC chip 180 which in addition to including CPU 141 includes numerous other integrated hardware components. Namely, multifunctional IC chip 180 may include a display control block 106, several general purpose I/O ports 116, several interface blocks such as a USB circuit block 107 and UART block 108 for facilitating RS 232 communications, a UART block 109 for facilitating Irda communications, and a pulse width modulation (PWM) output block 114. Multifunctional processor IC chip 180 can also have other interfaces such as a PCMCIA interface 111, a compact flash interface 112, and a multimedia interface 113. If reader 5 includes a display 13d, display 13d may be in communication with chip 180 via display interface 106. Trigger 13t and keypad 13k (if included on reader 5) may be in communication with chip 180 via general purpose I/O interface 116. Multifunctional processor IC chip 180 may be one of an available type of multifunctional IC processor chips which are presently available such as a Dragonball IC processor chip available from Motorola, an Anaconda IC processor chip available from Motorola, a DSC IC chip of the type available from Texas Instruments or a multifunction IC Processor chip of a variety available from Clarity, Inc.

Frame grabber block 148 of IC chip 180 replaces the function of a frame grabbing field programmable gate array (FPGA) as discussed in commonly assigned application Ser. No. 09/954,081, (now U.S. Pat. No. 6,561,428) filed Sept. 17, 2001, entitled "Imaging Device Having Indicia-Controlled Image Parsing Mode," incorporated herein by reference and application Ser. No. 09/904,697, (now U.S. Pat. No. 6,722,569) filed Jul. 13, 2001, entitled "An Optical Reader Having a Color Imager" incorporated herein by reference. More particularly, frame grabber block 148 is specifically adapted collection of hardware elements programmed to carry out, at video rates or higher, the process of receiving digitized image data from image sensor chip 182 and writing digitized image data to system RAM 142 which in the embodiment shown is provided on a discrete IC chip. Frame grabber block 148 includes hardware elements preconfigured to facilitate image frame capture. Frame grabber block 148 can be programmed by a user to capture images according to a user's system design requirements. Programming options for programming frame grabber block 148 include options enabling block 148 to be customized to facilitate frame capture that varies in accordance with image sensor characteristics such as image sensor resolution, clockout rating, and fabrication technology (e.g. CCD, CMOS, CID), dimension (1D or 2D) and color (monochrome or color).

Aspects of the operation of circuit 100 when circuit 100 captures image data into RAM 140 are now described. When trigger 13t is pulled, CPU 141, under the operation of a program stored in system ROM 143, writes an image capture enable signal to image sensor chip 182 via communication line 151. Line 151, like the remainder of communication lines described herein represents one or more physical communication lines. In the embodiment shown, wherein image sensor chip 182 is of a type available from IC Media Corp., I$^2$C interface 115 of chip 180 is utilized to facilitate communication with chip 182 (if another image sensor chip is selected another type of interface e.g. interface 116 may be utilized). Other types of signals may be sent over line 151 during the course of image capture. Line 151 may carry, for example, timing initialization, gain setting and exposure setting signals.

When control block 135 of image sensor chip 182 receives an image capture enable instruction, control block 135 sends various signals to frame grabber block 148. Image sensor control block 135 typically sends various types of synchronization signals to frame grabber block 148 during the course of capturing frames of image data. In particular, control block 135 may send to frame grabber block 148 "start of frame signals" which inform frame grabber block 148 that chip 182 is ready to transmit a new frame of image data, "data valid window" signals which indicate periods in which a row of image data is valid and "data acquisition clock" signals as established by clock 137 controlling the timing of image data capture operations. In the embodiment described, line 152 represents three physical communication lines, each carrying one of the above types of signals. In an alternative embodiment, vertical and horizontal synchronization signals are processed by frame grabber 148 to internally generate a data valid window signal. Frame grabber block 148 appropriately responds to the respective synchronization signals, by establishing buffer memory locations within integrated RAM 149 of block 148 for temporary storage of the image data received from image sensor chip 182 over data line 159. At any time during the capture of a frame of image data into system RAM 142, buffer RAM 149 of frame grabber block 148 may store a partial (e.g about 0.1 to 0.8) or a full line of image data.

Referring to further aspects of electrical circuit 100, circuit 100 includes a system bus 150. Bus 150 may be in communication with CPU 141 via a memory interface such as ELM interface 117 of IC chip 180. System RAM 142 and system ROM 143 are also connected to bus 150 and in communication with CPU 141 via bus 150. In the embodiment shown, RAM 142 and ROM 143 are provided by discrete IC chips. System RAM 142 and system ROM 143 could also be incorporated into processor chip 180.

In addition to having system RAM 142, sometimes referred to as "working" RAM, electrical circuit 100 may include one or more long term storage devices. Electrical circuit 100 can include for example a "flash" memory device 120. Several standardized formats are available for such flash memory devices including: "Multimedia" (MMC), "Smart Media," "Compact Flash," and "Memory Stick." Flash memory devices are conveniently available in card structures which can be interfaced to CPU 141 via an appropriate "slot" electromechanical interface in communication with IC chip 180. Flash memory devices are particularly useful when reader 5 must archive numerous frames of image data. Electrical circuit 100 can also include other types of long term storage such as a hard drive which may be interfaced to bus 150 or to an appropriate I/O interface of processor IC chip 180.

In a further aspect of electrical circuit 100, control circuit 140 is configured to control the turning off and turning on of LEDs 16, 18 and laser diode 60d of illumination block 160. Control circuit 140 preferably controls illumination block 160 in a manner that is coordinated with the capturing of the frames of image data. Illumination LEDs 16 are typically on during at least a portion of frame capture periods. Configuring circuit 140 so that LEDs 16, 18, and diode 60d have off periods significantly reduces the power consumption of circuit 100.

In a further aspect of the electrical circuit 100, electrical circuit 100 can be configured so that PWM output interface 114 of IC chip 180 controls illumination LEDs of an imaging module such as illumination LEDs 16 of module 10-2.

In one embodiment, illumination block 160 is in communication with PWM output interface 114 and configured in such manner that LEDs 16 are turned on at a leading edge of PWM pulses output at PWM interface 114, and are turned off at falling edges of PWM pulses output at PWM interface 114. PWM interface 114 should be configured so that several pulses are generated and sent over communication line 153i during the time that a single row of pixels of image data are exposed to light prior to clocking out of pixel values corresponding to that row. Thus, illumination LEDs 16 would be turned on and off several times during the exposure period for exposing a row of pixels to light. Further, the number of pulses output by PWM output 114 during the time that a single row of pixels are exposed should not vary substantially from row to row. The pixel clock signal received at frame grabber block 148 of IC chip 180 can be utilized to generate the PWM output. It can be seen, therefore, that multifunctional IC chip 180 including frame grabber block 148 and PWM output 114 greatly simplifies the task of developing PWM signals for use in controlling illumination LEDs 16 of module 10.

In another embodiment, PWM output 114 and illumination block 160 are configured so that PWM output 114 controls the intensity of illumination, not the on time/off time of illumination. LEDs block 160 in such an embodiment can include a power supply circuit which is interfaced to PWM output 114 such that the PWM signal output at PWM output 114 varies the voltage or current supplied to LEDs 16.

In a further aspect of electrical circuit 100, aiming LEDs 18 of circuit 100 can be controlled by a signal transmitted by a general purpose I/O port 116 of IC chip 180 over communication line 153a. Multifunctional processor IC chip 180 can be programmed so that an aiming LED control signal controlling LEDs 18 is driven to an ON state when pixels of image sensor 32 are not being exposed to light. Such control of image sensor 32 alleviates any affect which aiming LEDs 18 would otherwise have on an image signal generated by image sensor 32. If it is desired to selectively turn LEDs 18 ON during intermediate exposure periods, image sensor 32 should be selected to be of a type wherein all rows of image sensor 32 are exposed simultaneously, or else should otherwise be controlled so that periods exist wherein no row of image sensor 32 is exposed to light.

In accordance with the invention, it will be seen that it may be advantageous to eliminate the affect of light from laser diode assembly 60 on an image signal generated by image sensor 32. Accordingly, referring to the time line of FIG. 3c, it may be advantageous to selectively drive laser diode signal 168 ON intermediate of frame exposure periods $P_1, P_2, P_3 \ldots$, as in the aiming LED control signal described hereinabove.

In general, a short range aiming pattern, $P_s$ (see FIG. 9a), as projected by aiming LEDs 18 is highly visible to a user only where reader 5 is in a short range reading distance (e.g. less than 36" from a target). Long range aiming pattern P as projected by laser diode assembly 60 is normally highly visible to user over all reading distances. In accordance with another aspect of the invention, which will be described herein, one or both of aiming LEDs 18 and targeting diode 60d can be selectively disabled in a manner depending on reading conditions, e.g. decoding delay time, reader-to-target distance.

Figure 3B:
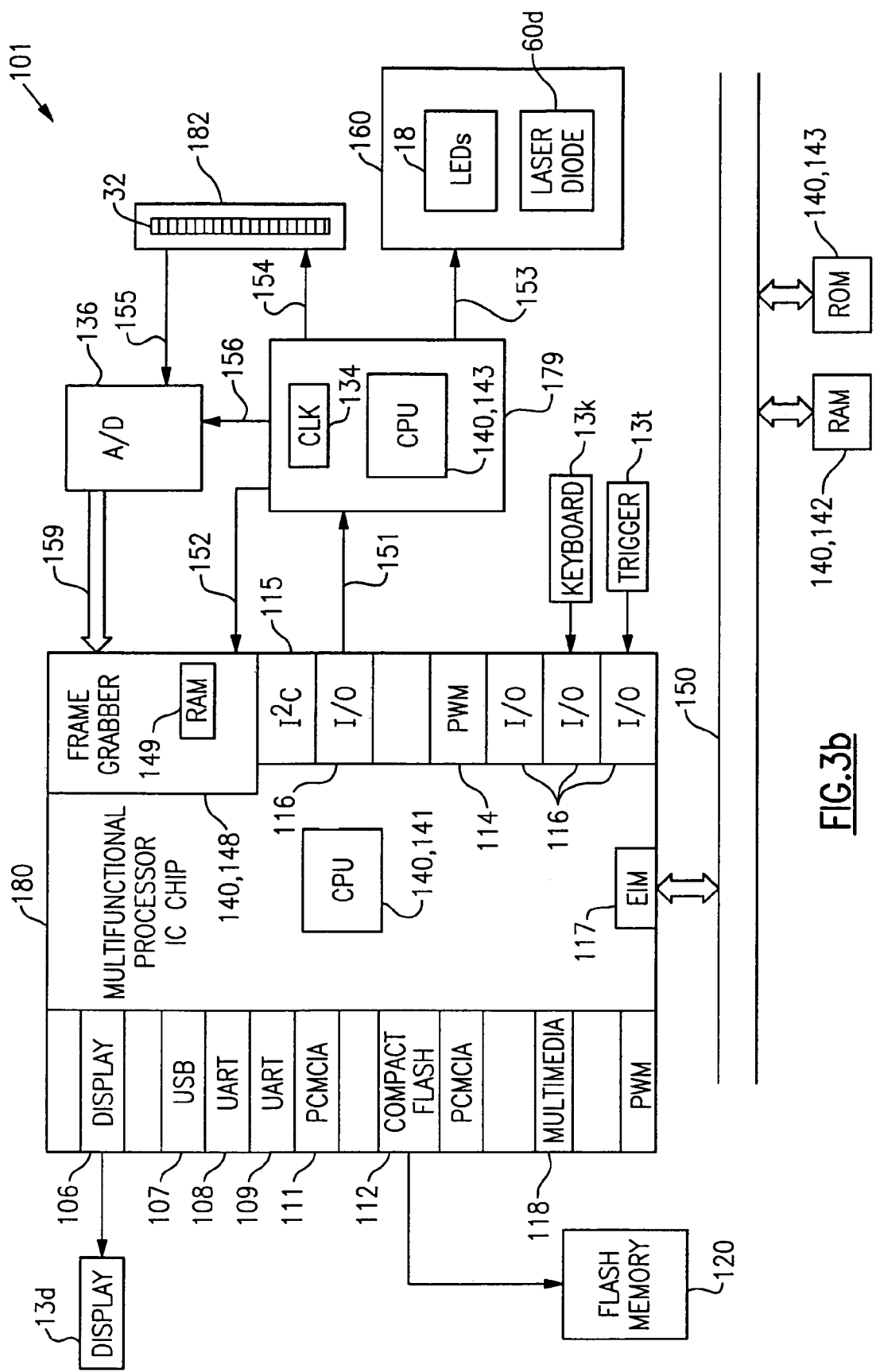

Referring now to FIG. 3b, electrical circuit 101 is described. Electrical circuit 101 controls operation of a single imaging module optical reader comprising a low cost 1D CCD image sensor 32 disposed on an IC chip 182. Image sensor 32 of FIG. 3b may be provided for example in a Toshiba Model TCD 1304 AP linear image sensor. Further aspects of an exemplary 1D imaging module are described, for example, in application Ser. No. 09/658,811, filed Sep. 11, 2000, entitled "Optical Assembly for Barcode Scanner," incorporated herein by reference.

Referring to aspects of electrical circuit 101 in detail, electrical circuit 101 includes a control circuit 140 which, like control circuit 140 of circuit 100 is partially incorporated in a multifunctional processor IC chip 180 including CPU 141 and a frame grabber block 148. Control circuit 140 of circuit 101 further includes system RAM 142, system ROM 143 and supplementary central processor unit (CPU) 141, integrated on processor IC chip 179. System RAM 142 and system RAM 143 are in communication with EIM interface 117 of IC chip 180 via bus 150.

Processor IC chip 179 provides control and timing operations similar to that provided by electrical block 134 of image sensor chip 182 described in FIG. 3a. Processor IC chip 179, in general, sends synchronization signals and digital clocking signals to IC chip 180, and sends digital clocking signals to A/D 136 and 1D image sensor chip 182 including image sensor 32. Processor IC chip 179 of circuit 101 may be a relatively low power processor IC chip such as an 8 BIT Cyprus PSOC CY8C26233-24PVI Microcontroller processor IC chip.

Aspects of the operation of IC chip 179 during the course of capturing slice image data will now be described in detail. When trigger 13t is pulled, CPU 141 transmits an image capture enable instruction over communication line 151. In response to receipt of an image capture enable instruction received from chip 180, processor IC chip 179 performs a variety of operations. Via communication line 152, processor IC chip 179 may send synchronization signals, such as "start of scan," "data valid window," and "data acquisition clock" signals to frame grabber block 148. Processor IC chip 179 may also send timing signals and digital clocking signals (e.g. master clock, integration clear gate, and shift gate pulse) to 1D image sensor chip 182 including 1D image sensor 32. Processor IC chip 179 typically also transmits a master clock signal to A/D block 136. Referring to further aspects of IC chip 180 of circuit 101, CPU 141 of chip 180, may also send e.g. gain setting, exposure setting, and timing initialization signals via line 151 to IC chip 179. Communication between IC chip 180 and IC chip 179 may be made via an SPI interface or I/O interface 116 of chip 180 and chip 179.

Processor IC chip 179 may be replaced by a programmable logic circuit, e.g. a PLD, CPLD, or an FPGA. IC chip 179 could also be replaced by an ASIC. Referring to further aspects of electrical circuit 101, analog voltage levels transmitted by image sensor 32 on line 155 are converted into gray scale pixel values by A/D converter 136 and then transmitted via line 159 to frame grabber block 148. Circuit 101 could also include a what may be referred to as an analog digitizer which processes an analog signal generated by image sensor 32 to generate a two-state output signal that changes state in accordance with light-to-dark and dark-to-light transitions of the image sensor analog output signal.

Processor IC chip 179 also controls illumination block 160. Illumination block 160 of a 1D long range image sensor reader 5 as explained with reference to FIGS. 2a and 2b typically includes a single bank of LEDs 18 which simultaneously illuminates a target area and projects a short range aiming pattern ($P_s$) facilitating aligning of the reader with a target indicia, and laser diode 60d of laser diode assembly 60. LEDs 18 of 1D imaging module 10-1 like LEDs 16, 18 of module 10-2 can be pulsed so as to reduce energy consumption by LEDs 18. Laser diode 60d can be controlled so as to be selectively turned on intermediate of frame exposure periods in the manner described with reference to the timing diagram FIG. 3c. That is, a laser diode control signal 168, as described with reference to FIG. 3c, can be selectively turned ON intermediate of frame (which comprise 1 or a limited number of rows of pixels in the case of a 1D image sensor), exposure periods $P_1$, $P_2$, $P_3$ to the end that light from laser diode assembly does not affect an image signal generated by image sensor 32.

Various alternative embodiments of the invention are now described with reference again to FIGS. 2a–2e and to FIGS. 4a–7h. Referring to the example of FIG. 4a laser diode assembly 60 is canted such that an axis $a_E$ of an emitted laser beam emitted by laser diode assembly 60 is at an angle with respect to imaging axis $a_I$ to the end that a spot of light P, is projected at a horizontal centerline 400 of a field of view of reader 5 at one specific reader distance, d. In such an embodiment the position of aiming pattern P with respect to a horizontal centerline 400 of a field of view of reader 5 will change depending on the reader-to-target distance. At close reader distances 70, module 15 will project an aiming pattern P above a horizontal centerline 400 of a field of view. At longer reader distances 71, pattern P will be projected below a centerline 400.

Module 10-1 as shown in FIGS. 2a and 2b is adapted so that a spot of light aiming pattern P projected by targeting system 60 remains at approximately the same position with respect to a centerline 400 of a field of view at all reader to target distances. Module 10-2 shown in FIGS. 2c–2e is devoid of light redirecting elements for redirecting laser beam light emanating from laser diode assembly 60. Module 10-1 on the other hand includes a prism 62 for redirecting aiming laser beam light emanating from laser diode assembly 60. As best seen in seen in FIG. 2b, prism 62 reduces the y-direction spacing between an emit axis $a_E$ corresponding to the path of emitted laser beam aiming light and an imaging axis $a_I$ of module 10-1. Reducing the y-direction spacing between emit axis $a_E$ and imaging axis $a_I$ results in the position of aiming pattern P being moved closer to a horizontal centerline 400 of a reader field of view. Prism 62 could be replaced by alternative light redirecting elements such as mirrors or a combination of mirrors and prisms. Prism 62 can be integrally formed on optical member 26 so that optical member 26 is a one piece unit comprising prism 62, at least one emit optical element 25 and at least one diffuser optical element 27.

While module 10-1 includes emit optic light folding elements (e.g. optics that fold light emitted from laser diode assembly 60), it may also be desirable to configure reader 5 so that reader 5 includes receive optic light folding elements. Module 10-4 of FIG. 4b includes mirrors 39 disposed in a receive optical path for folding imaging axis $a_I$ of module 10-4. Incorporating light folding optical elements in module 10-4 can reduce z-direction (length) space consumption requirements of module 10-4, rendering module 10-4 more readily fittable into optical reader housings having limited available space for accommodation of module 10-4. Mirrors 39 of module 10-4 can be replaced by a prism, prisms, or combination of mirrors and prisms. The desirability of incorporating light folding elements in an optical receive path of a long range reader module increases as the best focus receive distance of module 10 increases maintaining the characteristics of imaging optics 40 constant. The best focus distance of module 10, in general can be increased by increasing a focal length of optics 40 together with a distance between imaging optics 40 and image sensor 32. By incorporating light folding optics in a light receive path of module 10, a spacing between imaging optics 40 and image sensor 32 can be achieved without increasing the overall z-direction space consumption of module 10.

It will be appreciated that small errors in the relative positions of aiming laser diode assembly 60 and an imaging system (including sensor 32 and optics 40) can deleteriously affect the operation of reader 5. If emit axis $a_E$ is nominally parallel with imaging axis $a_I$ but as a result of manufacturing and/or assembly error is instead 1 degree angularly offset relative to imaging axis, a spot aiming pattern will be displaced 4.2 inches from its nominal position at a reading distance of 20 feet. Referring now to FIGS. 5a and 5b a method and apparatus for finely adjusting and securing a position of laser diode assembly 60 on module 10 is described.

Referring to module 10-5 of FIGS. 5a–5b, top surface 64 of support assembly 80 includes support members 86 extending upwardly therefrom. Support members 86 may be integrally formed on, bolted to, adhesively bonded to or otherwise securely attached to top surface 64 of assembly 80. Laser diode assembly 60 of module 10-4 is disposed within box housing 61 having sidewalls 61s. Sidewalls 61s of holder 61 and upwardly extending support members 86 have pin-receiving holes 87 formed therein. For installation of holder 61 on module 10-5 a resilient pad 89 is first installed in the holder receiving area of top surface 64 defined by support members 86. Resilient pad 89 may be secured on top surface 64 with use of adhesive. With resilient pad 89 located on top surface 64, holder 61 including diode assembly 60 is disposed within a holder-receiving area of module 10-5 defined by support members 86. Holder 61 is positioned on module 10-5 so that pin-receiving holes 87 of holder 61 (not shown) and support member 87 are aligned. With pin holes of holder 61 and support members 86 aligned, pins 88 are inserted into the aligned pin receiving holes 87.

Figure 5C:
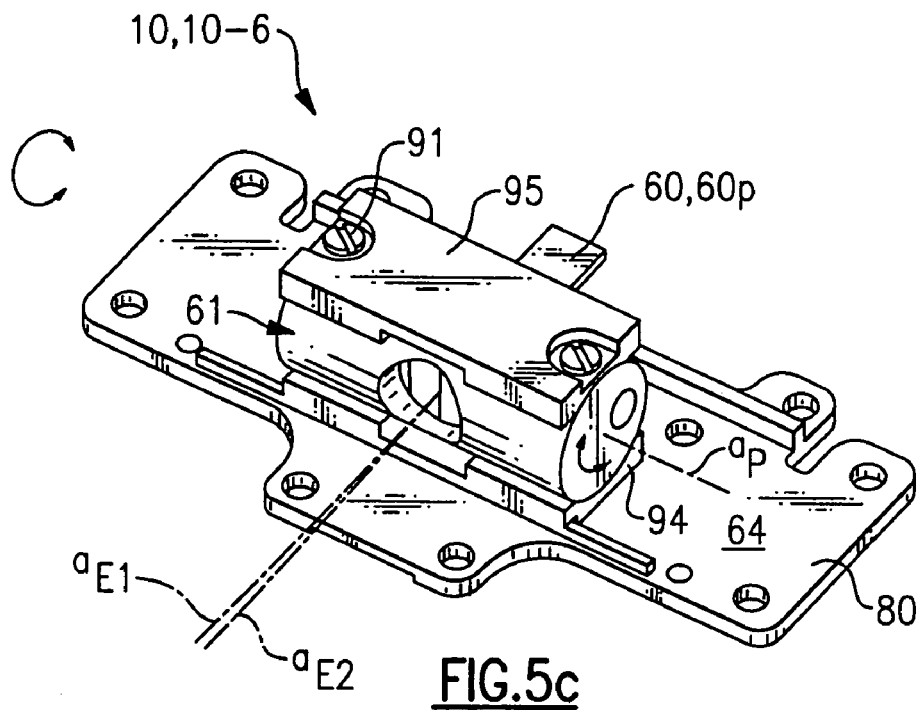
FIGS. 5c–5d are perspective views of a type of imaging module according to the invention.

Holder 61 pivots about an axis $a_p$ defined by pins 88 when pins 88 are installed in the aligned pin holes of holder 61 and support members 86. Pivoting holder 61 about axis $a_p$ adjusts an angle defined between emit axis $a_E$ and imaging axis $a_I$. For securing laser diode assembly 60 at a precisely defined angular position relative to imaging axis $a_I$, adjustment screw 90 fittable in holes of holder 61 and surface 64 is adjusted. For adjusting an angle between emit axis $a_E$ and imaging axis $a_I$, adjustment screw 90 is adjusted. As best seen in FIGS. 6a and 6b imaging module 10-5 includes a one piece optical member 26 having emit optic surface 25, for imaging an aperture 43 over a target, T, a negative lens surface 27, and integrated prism 62. One-piece member 26 further includes a window 29 disposed about imaging axis $a_I$ for allowing imaging light rays to pass there-through. Module 10-5 of FIGS. 5a and 5b may also include a spring 90s fitted over screw 90 and interposed between holder 61 and surface 64. Spring 90s, which biases holder 61 away from surface 64, may supplement or replace a biasing function provided by resilient pad 89.

Additional finely adjustably laser diode assembly mounting assemblies are described with reference to FIGS. 5c and 5d. In the embodiment of FIG. 5c, a bottom bed 94 of module 10-6 is disposed on top surface 64 of assembly 80, cylindrical holder 61 is placed on top of bed 94, and top clamp 95 is disposed over cylindrical holder 61. Bottom bed 94 and top clamp 95 have contours to allow pivotal rotation of holder 61 within the clamping assembly defined by bed 94 and top clamp 95. When a desired position of holder 61 within the clamping assembly is achieved, a clamping screw 91 is disposed through aligned screw-accommodating holes of top clamp 95, holder 61 and bed 94, and then tightened to secure holder 61 in a desired position. Screw holes of holder 61 should be elongated about a circumference of holder 61 to accommodate pivoting of holder 61.

Figure 5D:
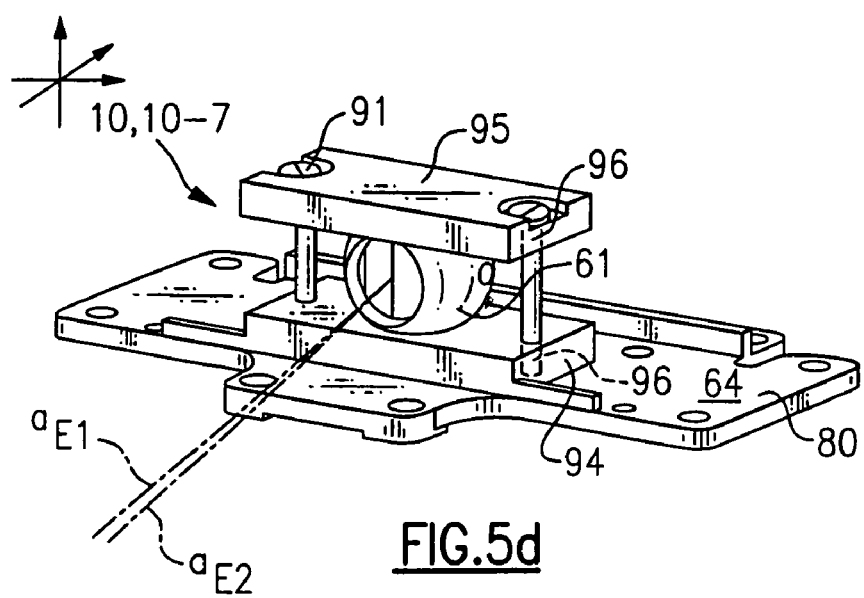

Referring to FIG. 5d, module 10-7 is constructed substantially the same as module 10-6 except that module 10-7 is adapted to allow rotational fine adjustment of holder 61 within a clamping assembly defined by top clamp 95 and bottom bed 94 instead of pivotal adjustment about a pivoting axis $a_p$ as in module 10-6. To facilitate rotational adjustment of holder 61 of module 10-7 holder 61 is ball shaped and complementary contours of top clamp 95 and bottom bed 94 are spherical so as to accommodate ball-shaped holder 61. When a desired rotational alignment of holder 61 is achieved, screws 91 are inserted into aligned holes 96 of clamp 95 and bed 94 and then tightened to secure holder 61 in a desired position.

The fine adjustment of the angle between emit axis $a_E$ and imaging axis $a_I$ can be aided with a visual feedback adjustment system. In one visual feedback system described with reference to FIG. 8a imaging module 10-5 having finely adjustable targeting optics is disposed in a fixture 810 which securely holds module 10 in a fixed position. Further, a test target substrate, s, (which may be provided by a wall) is disposed at a certain expected long range reading position (e.g. 5 feet, 10 feet, 20 feet, 30 feet) within the field of view of module 10. Printed matter 820, 822 may be formed on test substrate, s, for aiding the adjustment of laser diode assembly 60. Printed matter 820 may be an outline of the expected field of view of module 10 on substrate s. Printed matter 820 may be a small-height linear bar code adapted so that reading of the bar code included in printed matter 820 indicates that a field of view of module 10 coincides with printed matter 820. Printed matter 822 may be a marking for indicating the desired position of an aiming pattern P on test substrate s relative to the expected field of view. For fine adjustment of laser diode assembly 60, screw 90 (with reference to module 10-5) is loosened and or tightened until the beam projected aiming pattern coincides with printed matter marking 822. When a desired position is achieved (with reference to module 10-5) an adhesive may be applied to an interface between holder 61 and pin 88. In the case of modules 10-6 and 10-7 screws 91 are tightened when a desired position is achieved.

Another fine adjustment visual feedback system is described with reference to FIG. 8b. In the system described with reference to FIG. 8b the visual positioning feedback provided is electronically displayed visual feedback. As explained herein, laser diode assembly 60 can be advantageously turned on intermediate frame exposure period and turned off during frame exposure periods. In an assembly mode of operation as explained with reference to FIG. 8b, laser diode 60d of laser diode assembly 60 is turned on during frame exposure periods so that aiming pattern P if included in a field of view of module 10-5 will be represented in a captured image captured via actuation of module 10. In the system of FIG. 8b module 10-5 is provided in electrical communication with video monitor 68d (here provided by a personal computer assembly) and monitor 68d and module 10-5 are configured so that monitor 68d electronically displays an electronic representation 830 of a captured frame of image data. In the case module 10 includes a 2D image sensor representation 830 can be a 2d image representation. In the case module 10 includes a 1D image sensor, representation 830 can be an enhanced height visual representation, as is shown in the embodiment of FIG. 8b. Representation 830 can also be a false color representation. At very close reading distances aiming pattern P may not be visible in a captured 1×N "slice" frame of image data if emit axis $a_E$ and imaging axis $a_I$ are substantially spaced and in parallel relation. However, at longer reading distances, beam projected aiming pattern P will be represented within a slice frame of image data. In the adjustment system described with reference to FIG. 8b, fixture disposed module 10-5 and substrate s are spaced apart at such distance so that when an aiming beam traveling along axis $a_E$ is parallel with imaging axis $a_I$, aiming pattern P projected on substrate s by laser diode assembly 60 is detectable within a captured frame of image data but is not detectable if an angle between emit axis $a_E$ and imaging axis $a_I$ is incorrect. In the system described, set screw 90 can be gradually loosened from a tight position until aiming pattern P first becomes visible within electronically displayed representation (as indicated by aiming pattern representations $P_R$ of FIG. 8b), or electronically detectable within a frame. When such a feedback is achieved, the position of laser diode assembly 60 can be considered to be finely adjusted. Referring to the system of FIG. 8b, a representation $P_R$ of pattern P is included in displayed representation 830 of a captured frame of image data.

Figure 8A:
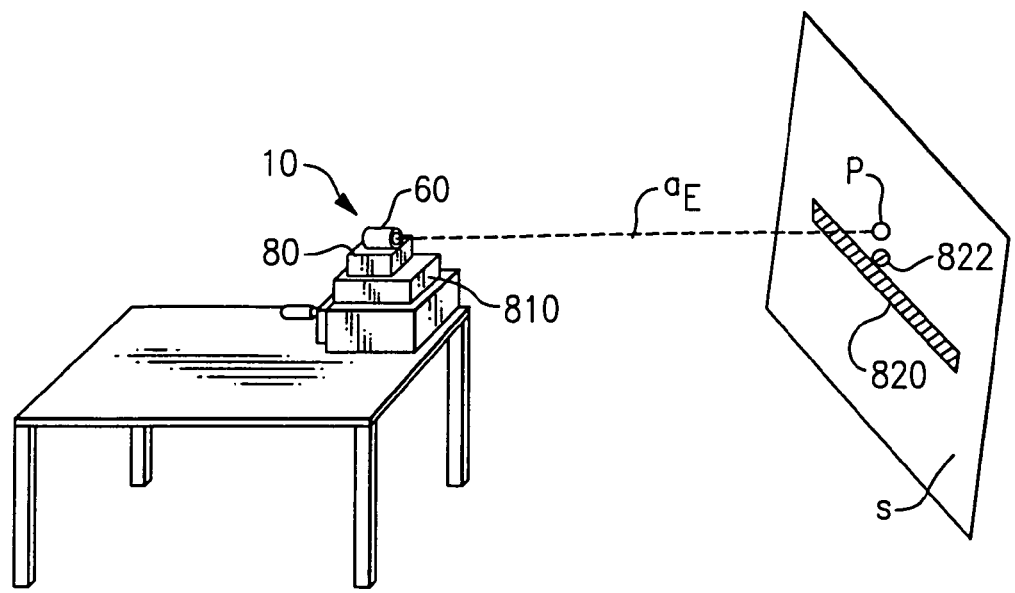
FIGS. 8a–8b are schematic diagrams illustrating methods for assembly of an imaging module according to the invention.
Figure 8B:
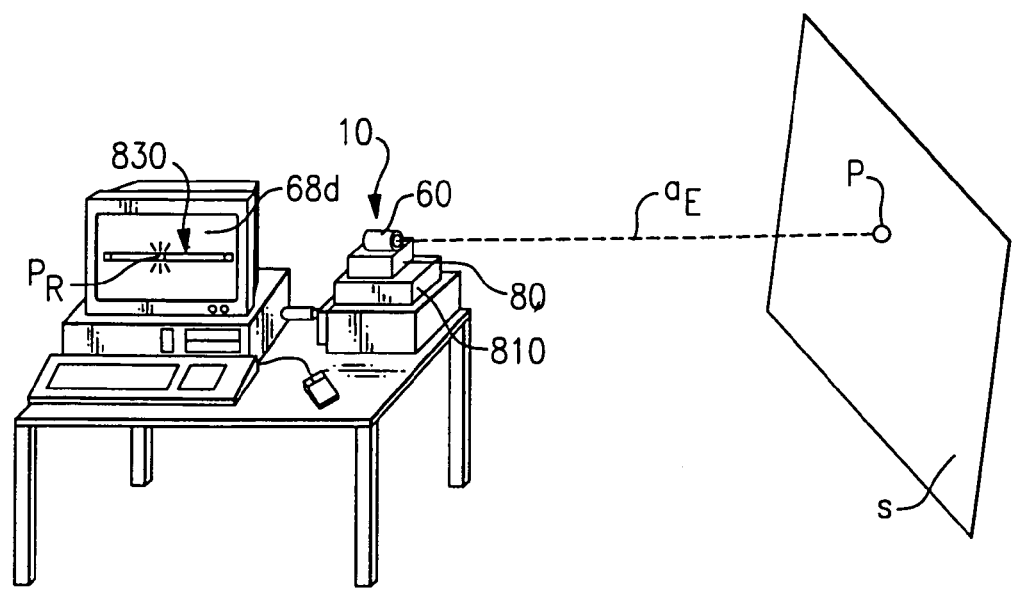

The printed matter feed back system of FIG. 8a and electronically displayed feedback system of FIG. 8b can be combined in a variety of useful ways. For example the printed matter 820, 822 of FIG. 8a can be formed on test target substrate s of FIG. 8b and can be captured and electronically displayed on a monitor 68d as in the system of FIG. 8b. A user can adjust the position of aiming pattern P to coincide with printed matter marking 822 while observing electronic display 68d to confirm that printed matter 822 is actually being captured by module 10. Module 10 of fine adjustment visual feedback systems of FIGS. 8a and 8b can include one fine adjustment mounting assemblies, e.g. one of the assemblies of modules 10-5, 10-6, 10-7 described with reference to FIGS. 5a–5e.

Referring to FIGS. 7a–7h showing top perspective schematic views of alternative imaging modules projecting various aiming patterns onto a target substrate, s, a variety of additional alternative embodiments of the invention for projecting multiple spot aiming patterns P are described. A long range aiming pattern comprising a pair of aiming spots, $P_1$ and $P_2$, if projected on a line parallel with a horizontal centerline 400 of a field of view of imaging module 10 aid in the X-Y plane rotational alignment of module 10 with respect to a target indicia, i.

Figure 7A:
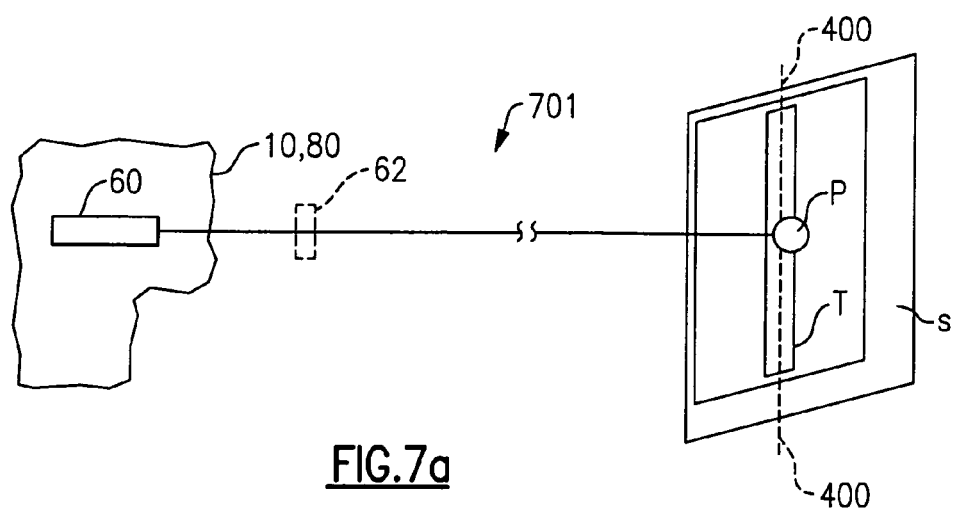
FIGS. 7a–7h illustrate schematic views of various long range aiming systems according to the invention.

For reference, a schematic block diagram corresponding to modules 10-1, 10-3, 10-4, and 10-5 previously described having a single laser diode assembly 60 projecting a single spot aiming pattern P is shown in FIG. 7a. In system 701 of FIG. 7a, laser diode assembly 60 mounted on module 10 projects a single spot aiming pattern P onto a target substrate P. Generally, the spot P is projected slightly above a horizontal centerline 400 of a field of view of module 10 delimited by target, T. System 701 includes an optional prism 62 as described previously which affects the vertical axis positioning of pattern P.

Figure 7B:
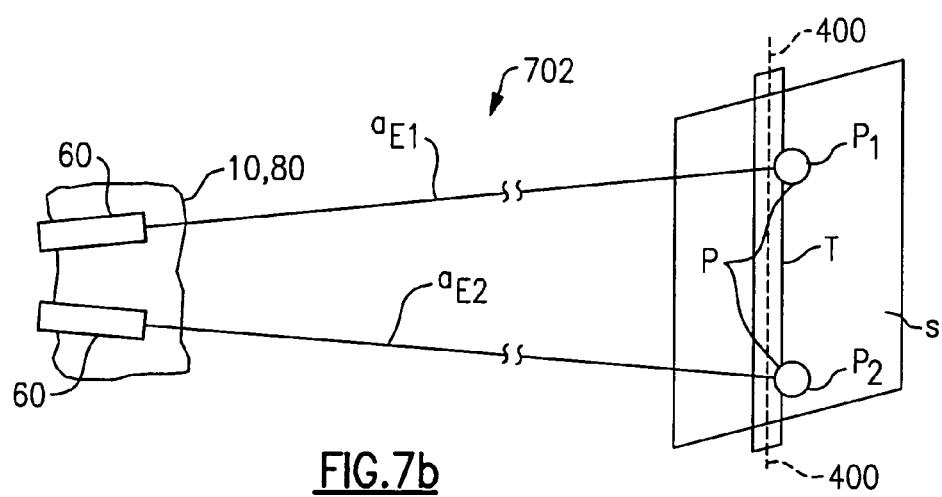

In system 702 shown in FIG. 7b, a pair of laser diode assemblies 60 mounted on module 10 project an aiming pattern P comprising two spots $P_1$ and $P_2$ on a target substrate, s. Diode assemblies 60 are arranged so that emit axes $a_{E1}$ and $a_{E2}$ of the two diode assemblies are in diverging relation. Configured in such manner, aiming spots $P_1$ and $P_2$ of aiming pattern P are substantially spaced apart at expected reading distances.

Figure 7C:
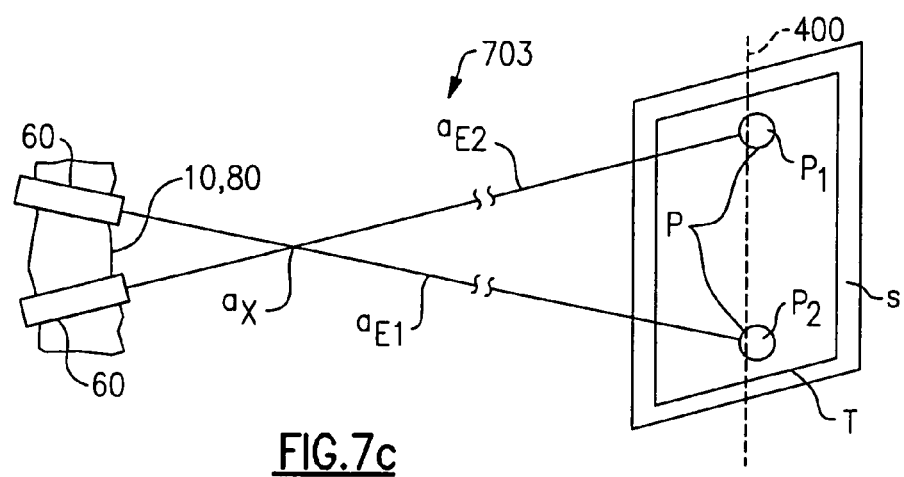

A pair of laser diode assemblies 60 are also mounted to module support assembly 80 in system 703 depicted in FIG. 7c. In system 703 diode assemblies 60 are disposed in converging relation with so that apex, x, is defined at reading distances less than expected reading distances to the end that imaging axes $a_{E1}$ and $a_{E1}$ are in diverging relation at expected reading distances. System 703 like system 702 is configured so that spots $P_1$ and $P_2$ of aiming pattern P are substantially spaced apart at expected reading distances. Module 10 in system 703 is a 2D imaging module having a rectangular field of view corresponding to a target, T, as opposed to slice field of view corresponding to slice targets, T, depicted in systems 701 and 702.

Figure 7D:
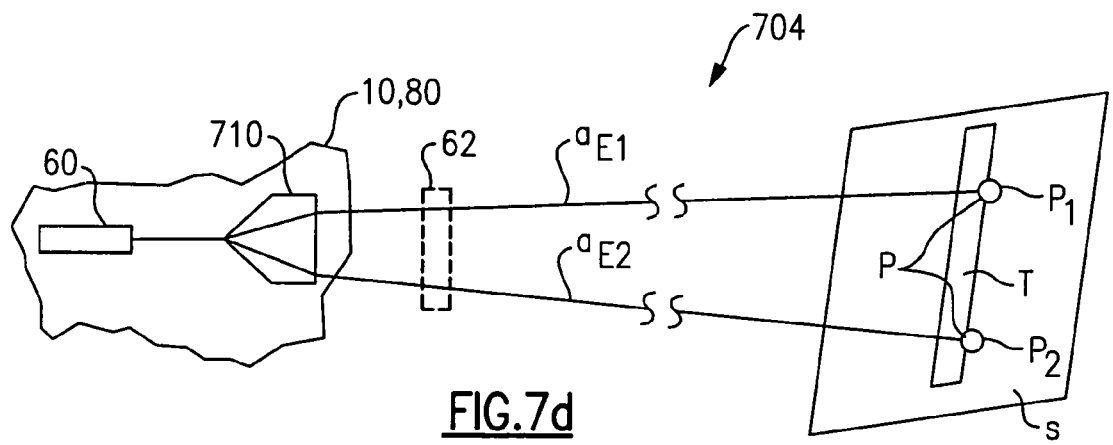

In system 704 depicted in FIG. 7d a single laser diode assembly 60 is disposed on module support assembly 80 together with prism 62. Prism 710 is shaped and disposed so that a light beam entering prism 710 is split to generate two exit beams traveling along beam axes $a_{E1}$ and $a_{E2}$. System 704 like system 702 and system 703 is configured so that expected reading distances, spots P1 and P2 of aiming pattern P are in diverging relation. A physical form view of system 704 is provided by FIGS. 5c and 5d, showing perspective views of module 10-6 and module 10-7, respectively. Shown as being an apex-out type prism, prism 710 could be provided by an apex-in type prism.

Figure 7E:
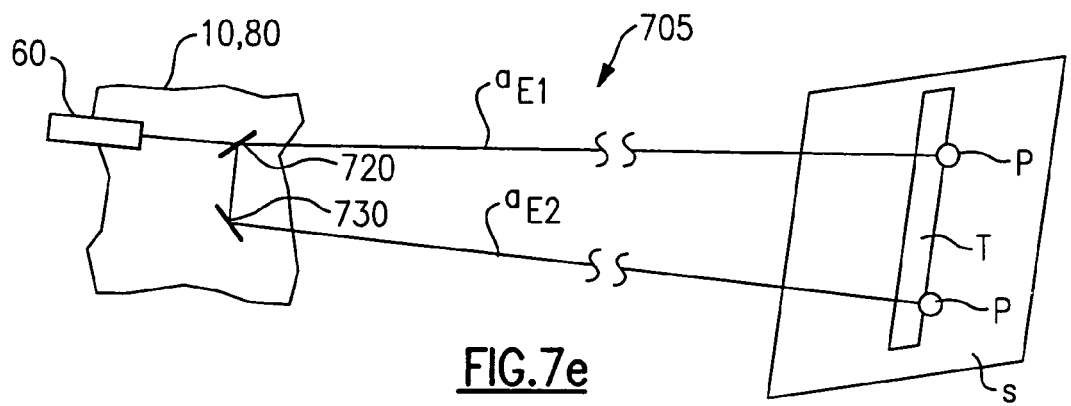

In system 705 depicted in FIG. 7e a single laser diode assembly 60 is mounted on support assembly 80 in combination with beam splitter 720 and mirror 730. A part of a light entry beam entering splitter 720 is transmitted through splitter 720 while a part of a light entry beam entering splitter 720 is directed to mirror 730 which directs the light beam to target substrate, s. System 705 is configured so that beams traveling along axes $a_{E1}$ and $a_{E2}$ are in diverging relation to the end that spots P1 and P2 of aiming pattern P are substantially spaced apart at expected reading distances.

Figure 7F:
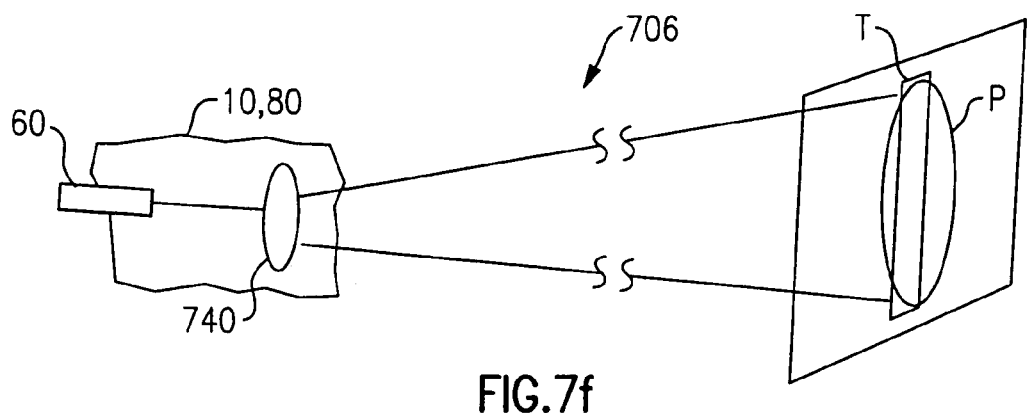

In system 706, depicted in FIG. 7f, a single laser diode assembly 60 is mounted on support assembly 80 together with a shaping optic 740. Shaping optic 740 shapes a laser light beam emanating from laser diode assembly 60 into an elliptical aiming pattern P which is visible at expected reading distances. Shaping optic 740 may be provided, for example, by a cylindrical lens.

Figure 7G:
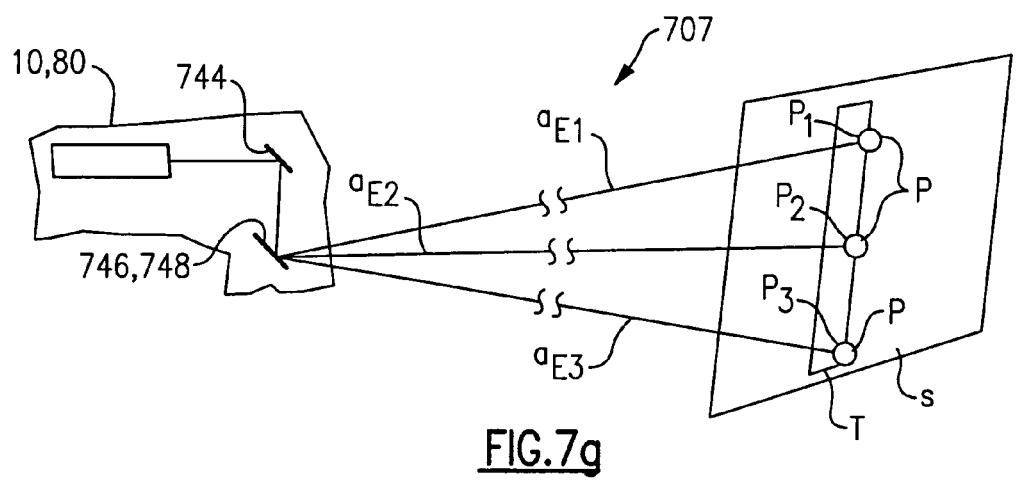

In system 707 depicted in FIG. 7g a single laser diode assembly 60 is mounted on support assembly 80 together with a first mirror 744 and a second mirror 746 having a diffractive element 748 formed thereon. Diffractive element 748 scatters a light beam directed thereto into three discrete light beams each traveling along one of emit axes $a_{E1}$, $a_{E2}$, $a_{E3}$. System 707 is configured so that beams having axes $a_{E1}$, $a_{E2}$, and $a_{E3}$ are in diverging relation to the end that spots $P_1$, $P_2$, and $P_3$ of pattern P are substantially spaced apart at expected reading distances. Diffractive element 748 could in another embodiment be spaced apart from mirror 746.

Figure 7H:
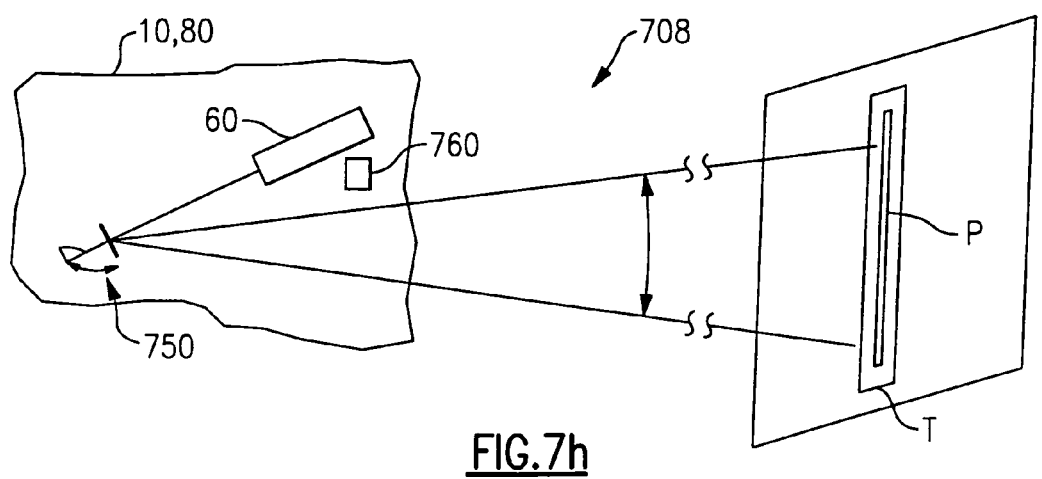

In system 708 depicted in FIG. 7h a single laser diode assembly 60 is mounted on support assembly 80 together with a moving mirror 750. Moving mirror 750 is moved to sweep a laser beam across a target substrate within a field of view of image sensor 32 delimited by target area T as depicted by FIG. 7h. Aiming pattern P in the embodiment of FIG. 7h appears as a straight thin line to a user. Moving mirror 750 may be pivoted or vibrated. Moving mirror 750 can be fabricated utilizing Micro-Electro-Mechanical Systems (MEMS) technology to the end that moving mirror 750 includes micromachined parts incorporated on an IC chip, wherein movement of the moving mirror 750 is responsive to a signal sent to the MEMS IC chip from control circuit 140. System 708 can further include a single photodetector 760 configured to sense light from scanned light beam as is reflected from substrate s so that laser diode assembly 60 in combination with moving mirror 750 in combination with photodetector 760 form the components of a laser scan engine. Signals generated by photodetector 760 can be digitized or subjected to analog-to-digital conversion and transmitted to control circuit 140. Control circuit 140 can subject the received signals to decoding so as to provide a secondary decoded output message that supplements a decoded out message generated as described previously by subjecting a frame captured via actuation of image sensor 32 to decoding.

Specific methods for operating long range reader 5 are described with reference to FIGS. 9a–9c. In FIG. 9a a long range reader 5 having a display 13d is shown which is adapted to be operated in three operating modes: (1) a "laser aimer enabled" mode corresponding to displayed message 910; (2) a "laser aimer disabled" mode corresponding to displayed message 912; and (3) an "adaptive laser aimer" mode corresponding to displayed message 914. These three modes can be actuated via selection of the appropriate key of key board 13k or other known GUI highlighting or pointer based selection method. If reader 5 does not include a display 13d and keyboard 13k or if another menu interface is desired, the selection of a desired menu option can be made by reading an appropriate "menu symbol" as described in U.S. Pat. No. 5,929,418, entitled "Optical Reader Having Improved Menuing Features" incorporated by reference or by transmission of a command from a host computer such as a PC which is in communication with reader 5. While long range aiming pattern P is highly useful in aiding the alignment of reader 5, long range aiming pattern P may not be necessary in certain circumstances. For example, at short range reading distances as depicted in FIG. 9a, a reader can be adequately aligned with use of short range LED projected aiming pattern Ps projected by aiming/illumination LEDs 18 of a 1D imaging module or aiming LEDs 18 of 2D imaging module as described herein. If long range aiming pattern P is not necessary for aiding the alignment of reader 5 it may be desirable to disable laser diode assembly 60 for purposes of reducing energy consumption.

If mode 1, "laser aimer enabled" is selected, laser diode assembly 60 is always enabled until the mode is changed. That is, every time trigger 13t is pulled, laser diode 60d is actuated at least during periods intermediate of frame exposure periods.

If mode 2, "laser aimer disabled" is selected, aimer laser diode assembly 60 is disabled until a mode is changed. That is, laser diode 60d is never actuated even when trigger 13t is pulled, until a mode is changed.

If mode 3, "adaptive laser aimer," is selected, laser diode assembly 60 is adaptively enabled or disabled depending on a sensed reader condition.

Figure 9B:
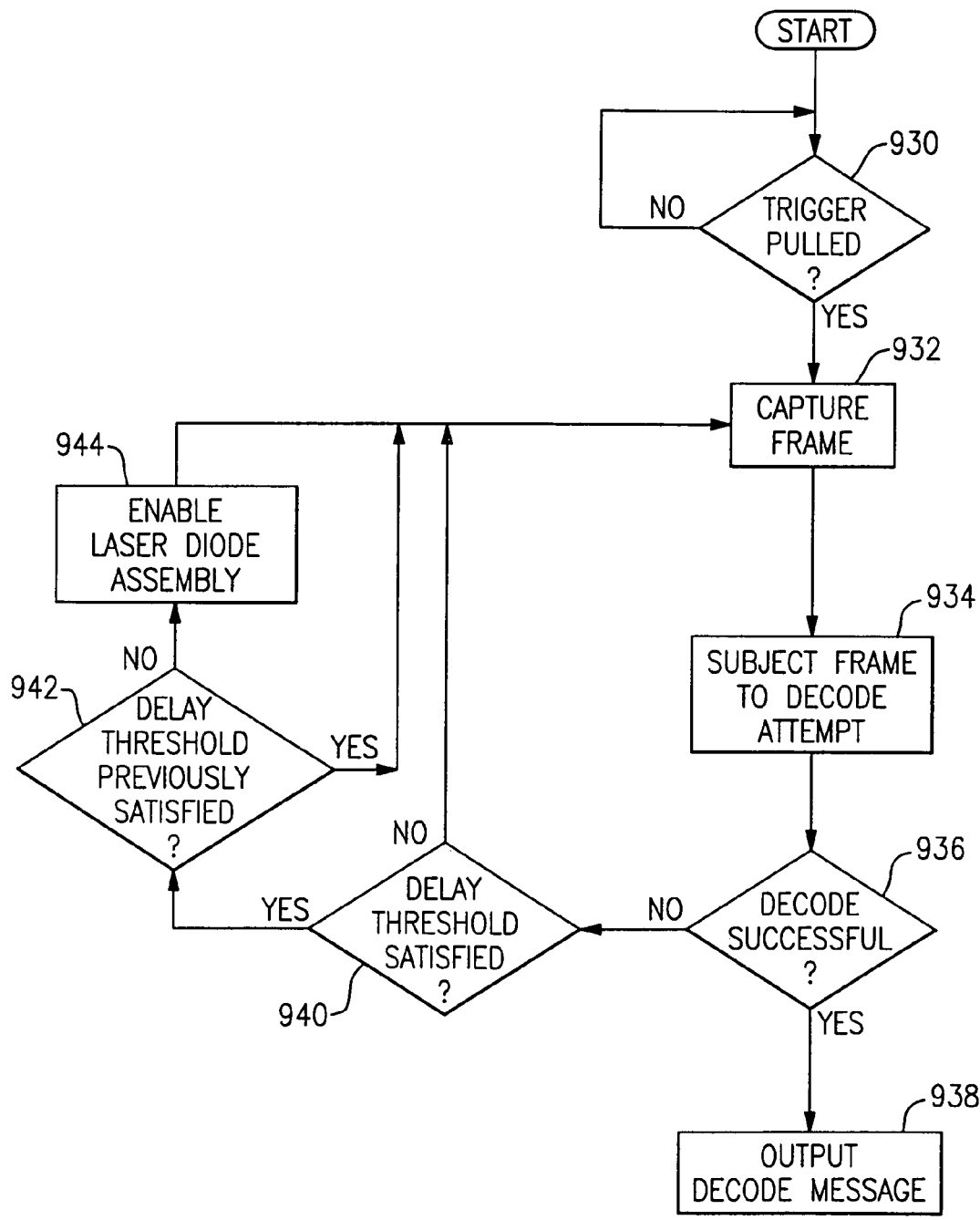
FIGS. 9b–9c are flow diagrams illustrating methods for controlling an optical reader according to the invention.
Figure 9C:
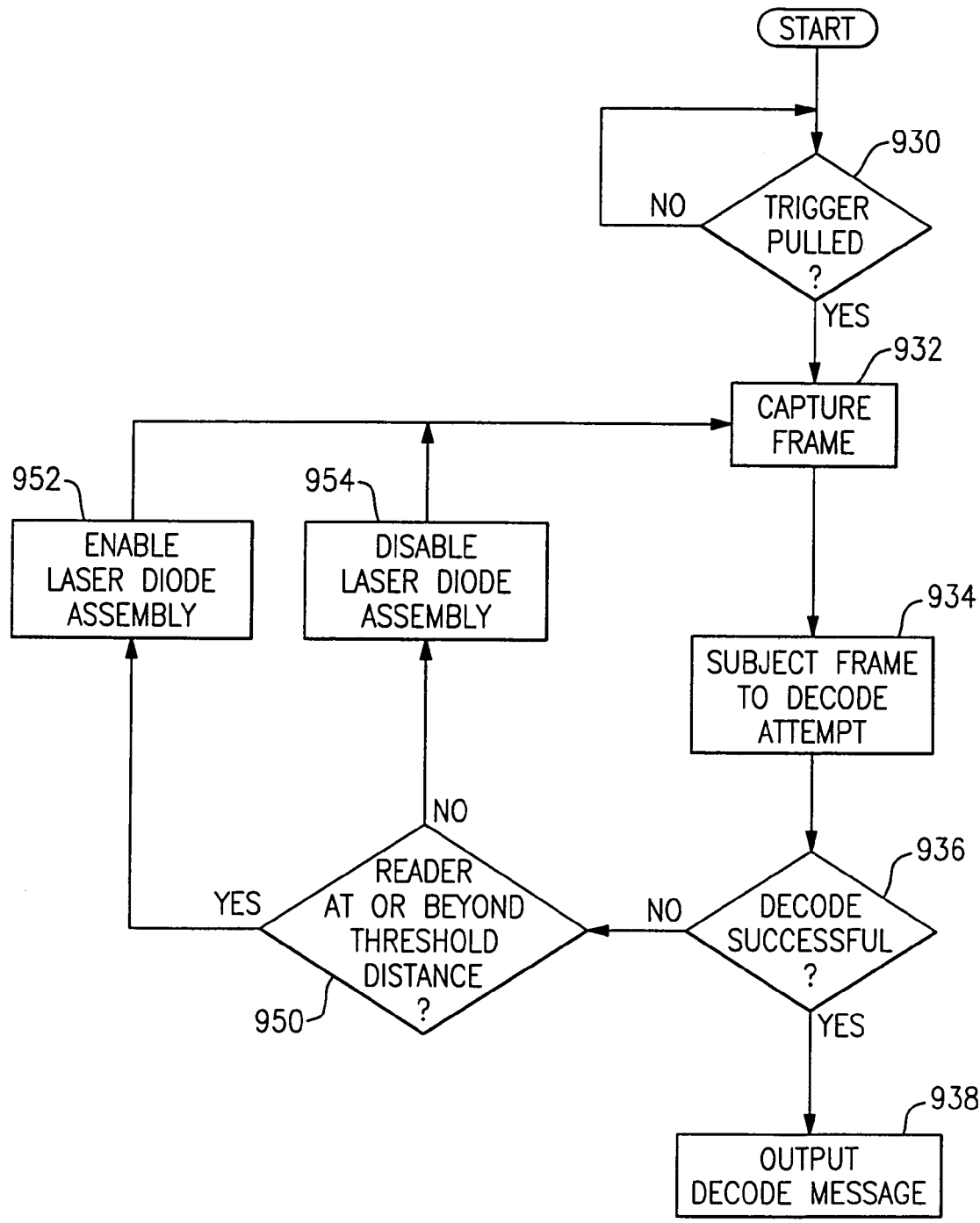

With reference to the flow diagram of FIG. 9b a reader control method is described wherein laser diode assembly 60 is adaptively enabled or disabled depending on whether a delay threshold has been satisfied. At block 930 control circuit 140 determines if a trigger 13t has been pulled. If trigger 13t has been pulled, control circuit 140 proceeds to block 932 to capture a frame of image data, and then to block 934 to subject the frame of image data to a decode attempt. The attempt to decode decodable indicia may be made in accordance with one of a decoding methods that is described in U.S. application Ser. No. 09/904,697, filed Jul. 13, 2001, entitled "Optical Reader Having a Color Imager," incorporated herein by reference. If controller 140 at block 936 determines that decoding was successful, control circuit 140 at block 938 outputs the decoded message. If decoding was not successful, control circuit 140 proceeds to block 940 to evaluate whether a delay threshold has been satisfied by reader 5. The current delay of reader 5 may be calculated based on the real time elapse accruing from the time that trigger 13t is first pulled (block 930) utilizing a real time clock function of IC chip 180. The delay condition can also be calculated, for example, based on the number of frames that have been captured since the time that trigger 13t was pulled or by another suitable method. If the delay threshold has been satisfied, control circuit 140 proceeds to block 944 to enable laser diode 60d from a normally disabled state. Block 942 indicates that control circuit 140 does not have to repeatedly re-enable diode assembly 60 after enabling assembly 60 a first time. The invention, therefore, includes an optical reader comprising an imaging assembly having a plural photodetector image sensor and an imaging axis; an illumination assembly comprising at least one illumination LED and at least one laser diode assembly, wherein said laser diode assembly is adapted to project a long range aiming pattern onto a target substrate; a control circuit in communication with said imaging assembly and said illumination assembly, wherein said reader has an adaptive laser aimer operating mode wherein said control circuit, in response to receipt of a trigger signal calculates a delay; and enables said laser diode assembly if said delay is equal to or greater than a threshold delay.

Incorporating the method of FIG. 9b into reader 5 configures reader 5 so that long range aiming pattern P is projected onto a target substrate, s, only after a delay threshold has been satisfied. In some reading applications, reading may be so readily accomplished that long range aiming pattern P may not be needed for aiming reader 5. By the control method of FIG. 9b laser diode assembly 60 is adaptively enabled only under difficult reading conditions (which may be long range reading conditions) wherein reading is not successful within a predetermined time delay threshold.

Another adaptive laser aimer control method is described with reference to FIG. 9c. The processing steps of blocks 930 of the flow diagram of FIG. 9c, 932, 934, 936, and 938 are identical to those described above with reference to the flow diagram of FIG. 9b. However, at block 950 of the method of FIG. 9c control circuit 140 determines whether a reader-to-target distance threshold has been satisfied rather that determining whether a delay threshold has been satisfied as in block 940 (FIG. 9b). If control circuit 140 at block 950 determines that reader 5 is at least as far from a target as a predetermined threshold distance, control circuit 140 proceeds to block 952 to enable laser diode assembly 60. When diode assembly 60 is enabled control circuit 140 may pulse diode "on" intermediate of frame exposure periods as described herein. If control circuit 140 determines that a current reader-to-target distance is less than a threshold distance, then control circuit 140 proceeds to block 954 to disable aimer laser diode assembly 60.

Control circuit 140 may calculate a current reader-to-target distance in a number of different ways. A method for generating a "degree of focus" signal which is indicative of reader-to-target distance is described in U.S. Pat. No. 5,773,810, issued Jun. 20, 1998, entitled "Method for Generating Real Time Degree of Focus Signal for Handheld Imaging Device," incorporated herein by reference. In addition it is seen that in any one of aiming systems 702–705, a reader-to-target distance can be normally estimated based on the spacing between representations of aiming spots P1, P2 in a captured image. It has been described herein that it is normally desirable to control laser diode 60d to be OFF during frame exposure periods. It is seen that it would be desirable to control diode 60d to be ON during exposure periods in the case that image information corresponding to spots P1 and P2 is utilized in estimating reader-to-target distance. It may be unnecessary to actuate laser diode assembly 60 in short range reading conditions. The method described with reference of FIG. 9c automatically senses a reader-to-target distance and disables assembly 60 if the reader is in short range.

With further reference to the adaptive laser assembly control methods described with reference to FIGS. 9b and 9c, an "enable laser diode assembly instruction (block 944, block 952) can be coupled with a "disable LED illumination" instruction, which is executed by control circuit 140 to disable LEDs of module 10 such as LEDs 18 of 1D module 10-1 and either or both of illumination and aiming LEDs 16, 18 of 2D module 10-2 (FIG. 2e). At long range reading applications light from LEDs may be unnecessary, as explained herein, particularly under high ambient light conditions. It will be seen that "disable laser diode assembly" of block 954, FIG. 9c, can similarly be combined with an "enable LED" instruction.

In a further aspect of the invention, a plurality of imaging modules 10 can be incorporated in reader 5. Various designed for plural imaging module readers and electrical circuits for operating such readers are described in U.S. application Ser. No. 10/161,950 filed Jun. 4, 2002, entitled "Optical Reader Having a Plurality of Imaging Modules," incorporated herein by reference.

Figure 10:
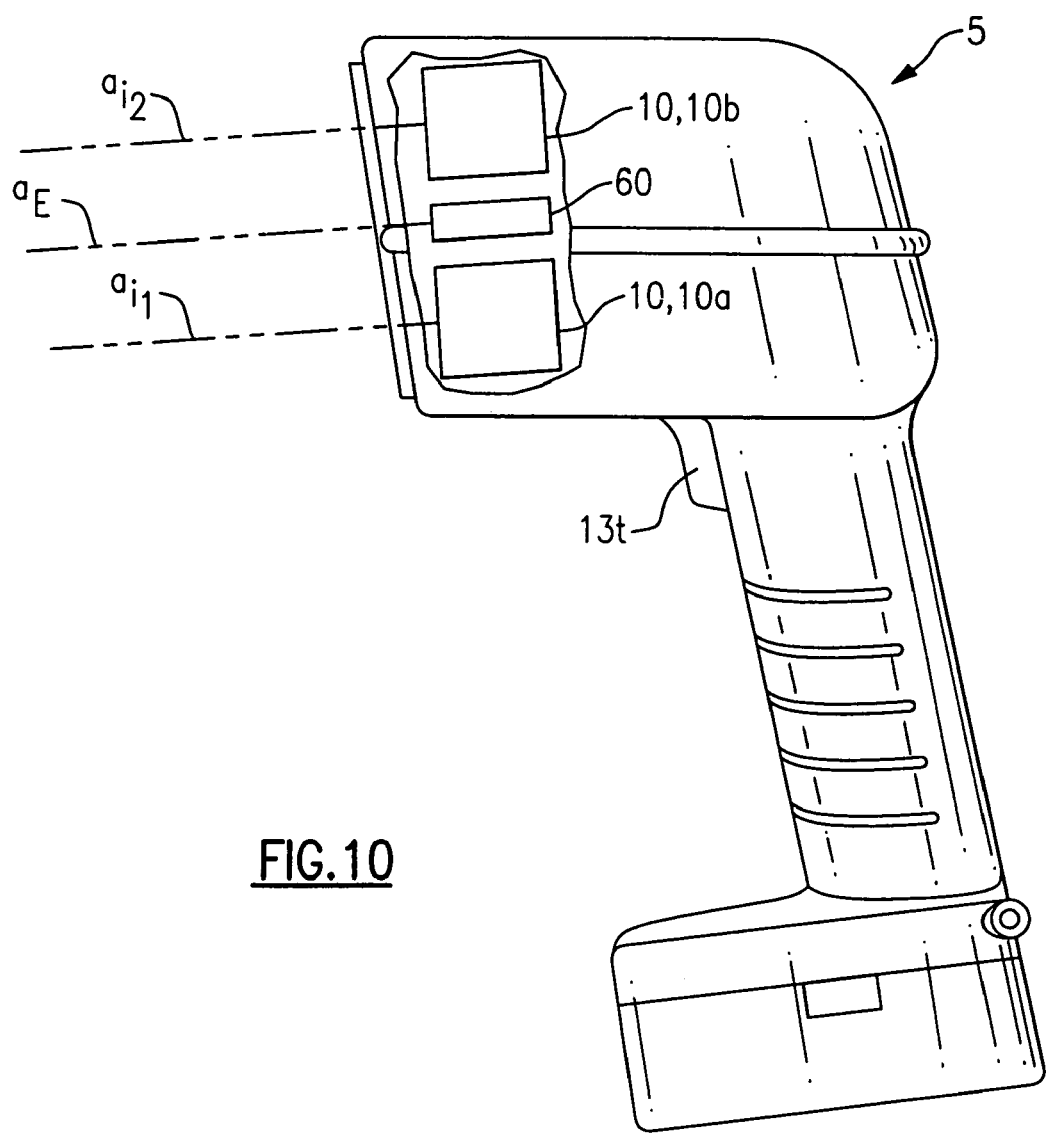
FIG. 10 is a side view of an optical reader according to the invention having a plurality of imager modules.

In the embodiment of FIG. 10 long range reader 5 includes a pair of stacked imaging modules 10a and 10b and a laser diode based targeting system including laser diode assembly 60 which in the specific embodiment shown is not attached to either of module 10a or module 10b. (Assembly 60 can also be mounted to module 10a and/or 10b as described with reference to FIGS. 2a–2e). Lower and first imaging module 10a is adapted for short range reading and is configured to have a best focus receive distance of less than 1 foot. Upper and second imaging module 10b is adapted for long range reading and includes a best focus receive distance of about 5 feet (or alternatively, e.g. 10 feet, 20 feet, and 30 feet). Plural imaging module reader 5 as shown in FIG. 10 may be operated in accordance with the flow diagrams as explained in FIGS. 9b and 9c, with a modification in that all frames of image data captured when laser diode assembly 60 is disabled are captured via an actuation of an image sensor of short range module 10a and all frames captured when assembly 60 is enabled are captured via actuation of an image sensor of long range module 10b.

In one embodiment, both of modules 10a and 10b are 1D modules as described e.g. with reference to FIGS. 2a, 2b, 5a, 5b, 5c, and 5d. In another embodiment, both modules 10a and 10b are 2D imaging modules as described e.g. in relation to FIGS. 2c–2e. In yet another embodiment, one of modules 10a or 10b is a 1D imaging module and another of modules 10a or 10b is a 2D imaging module.

While the present invention has been particularly shown and described with reference to the preferred mode as illustrated in the drawing, it will be understood by one skilled in the art that various changes in detail may be effected therein without departing from the spirit and scope of the invention as defined by the claims.

We claim:

1. An optical reader for reading a decodable indicia disposed on a substrate, said optical reader comprising:
   an imaging assembly including an image sensor having a plurality of photodetectors, said imaging assembly further including optics focusing an image onto said image sensor, said image sensor being selected from the group consisting of a 1D image sensor and a 2D image sensor, said imaging assembly further having an imaging axis;
   a hand held housing encapsulating said image sensor;
   a manual trigger disposed proximate a periphery of said hand held housing;
   a targeting system including at least one laser diode assembly, said targeting system being configured to direct laser light toward said substrate; and
   a control circuit communicatively coupled to said imaging assembly, said manual trigger and said targeting system, said control circuit being configured so that in response to said manual trigger being actuated said control circuit (a) repetitively captures frames of image data and attempts to decode decodable indicia represented therein, (b) counts a delay, wherein said control circuit further in response to said manual trigger being actuated (c) maintains said laser diode assembly in an OFF state if said control circuit successfully decodes an indicia prior to a time at which said delay is equal to or exceeds a threshold delay, and (d) drives said laser diode assembly into an ON state if said delay becomes equal to or greater than said threshold delay prior to a time at which said control circuit successfully decodes a decodable indicia.

2. The optical reader of claim 1, wherein said threshold delay is predetermined.

3. The optical reader of claim 1, wherein said optical reader further includes at least one light emitting diode directing light toward said substrate.

4. The optical reader of claim 1, wherein said optical reader further includes at least one light emitting diode directing light toward said substrate, said at least one light emitting diode emitting light at a wavelength different from light emitted by said at least one laser diode assembly.

5. The optical reader of claim 1, wherein said image sensor is a 1D image sensor.

6. The optical reader of claim 2, wherein said image sensor is a 2D image sensor.

7. The optical reader of claim 1, wherein said control circuit counts said delay utilizing a real time clock.

8. The optical reader of claim 1, wherein said optical reader further includes an illumination LED, and wherein said control circuit drives said illumination LED into an OFF state if said delay becomes equal to or greater than said threshold delay prior to a time at which said control circuit successfully decodes said decodable indicia.

9. An optical reader comprising:
   an imaging assembly having a plural photodetector image sensor and an imaging axis;
   an illumination assembly comprising at least one illumination LED and at least one laser diode assembly, wherein said illumination assembly is adapted to project an aiming pattern onto a substrate; and
   a control circuit in communication with said imaging assembly and said illumination assembly, wherein said reader has an operating mode in which said control circuit, in response to receipt of a trigger signal:
   calculates a delay;
   captures at least one frame of image data;
   subjects said at least one frame of image data to an indicia decode attempt; and
   enables said laser diode assembly to project said aiming pattern onto said substrate provided that said indicia decode attempt is not successful and said delay is equal to or greater than a threshold delay.

10. The reader of claim 9, wherein said control circuit subsequent to receipt of said trigger signal captures a plurality of frames of image data and subjects each of a plurality of said captured frames of image data to a decode attempt, and wherein said control circuit in response to a receipt of said trigger signal enables said laser diode assembly to project said visible laser light onto said substrate in said predetermined pattern provided that each of said plurality of decode attempts is not successful and said delay is greater than or equal to said threshold delay.

11. The reader of claim 9, wherein said plural photodetector image sensor is a 1D image sensor.

12. The reader of claim 9, wherein said plural photodetector image sensor is a 2D image sensor.

13. The reader of claim 9, wherein said LED projects light onto said substrate at a wavelength different than a wavelength of light emitted by said laser diode assembly.

14. The reader of claim 9, further including a prism for redirecting an optical path of a beam emitted by said laser diode assembly.

15. The reader of claim 9, wherein said imaging assembly includes a best focus distance of at least five feet.

16. The reader of claim 9, wherein said reader includes an optical assembly which splits a beam emitted by said laser diode assembly to project a plurality of spots on a target substrate, said spots being projected substantially along a horizontal centerline of a target.

17. The reader of claim 9, further including a hand held housing encapsulating said image sensor.

18. The reader of claim 9, wherein said reader includes an imaging module installed within said housing, said imaging module having a support assembly carrying said image sensor together with imaging optics.

19. The reader of claim 9, wherein said optical reader includes a fixed best focus position.

20. The reader of claim 9, wherein said illumination assembly includes a slit aperture and emit optics for imaging said slit aperture onto said substrate, wherein said emit optics are adapted so that said slit aperture is optimally focused onto said substrate at a reader distance greater than a best focus receive position of said reader.

21. The optical reader of claim 9, wherein said control circuit calculates said delay utilizing a clock.

22. The optical reader of claim 9, wherein said control circuit calculates said delay by monitoring an internal process of said reader.

23. The optical reader of claim 9, wherein control circuit further disables said illumination LED if said delay is equal to or greater than a threshold delay.

24. An indicia decoding device comprising:
an imaging assembly having a plural photodetector image sensor, an optics focusing target indicia onto said plural photodetector image sensor, and an imaging axis;
a hand held housing encapsulating said image sensor;
at least one laser diode assembly, wherein said laser diode assembly is adapted to project visible laser light onto a substrate in a predetermined pattern; and
a control circuit in communication with said imaging assembly and said illumination assembly, wherein said reader has an operating mode in which said control circuit, in response to receipt of a trigger signal:
calculates a delay;
captures at least one frame of image data;
subjects said at least one frame of image data to an indicia decode attempt; and
enables said laser diode assembly to project said visible laser light onto said substrate in said predetermined pattern provided that said decode attempt is not successful and a delay threshold has been satisfied, whereby enabling of said laser diode assembly is avoided if said control circuit successfully decodes a first frame of image data that is subject to a decode attempt subsequent to said receipt of said trigger signal.

25. The device of claim 24, wherein said control circuit subsequent to receipt of said trigger signal captures a plurality of frames of image data and subjects each of a plurality of said captured frames of image data to a decode attempt, and wherein said control circuit in response to a receipt of said trigger signal enables said laser diode assembly to project said visible laser light onto said substrate in said predetermined pattern provided that each of said plurality of decode attempts is not successful and said delay threshold has been satisfied.

26. The device of claim 24, wherein said image sensor, optics, and said laser diode assembly are commonly supported by a support assembly of an imaging module installed within said housing.

27. The device of claim 24, wherein said plural photodetector image sensor is a 1D image sensor.

28. The device of claim 24, wherein said plural photodetector image sensor is a 2D image sensor.

29. The device of claim 24, wherein said device further has an LED that projects light onto said substrate at a wavelength different than a wavelength of light emitted by said laser diode assembly.

30. The device of claim 24, further including a prism for redirecting an optical path of a beam emitted by said laser diode assembly.

31. The device of claim 24, wherein said imaging assembly includes a best focus distance of at least five feet.

32. The device of claim 24, wherein said reader includes an optical assembly which splits a beam emitted by said laser diode assembly to project a plurality of spots on a target substrate, said spots being projected substantially along a horizontal centerline of a target.

33. The device of claim 24, wherein said device further has an LED that projects light onto said substrate.

34. The device of claim 24, wherein said device includes a fixed best focus position.

35. The device of claim 24, wherein said device has an illumination assembly including a slit aperture and emit optics for imaging said slit aperture onto said substrate, wherein said emit optics are adapted so that said slit aperture is optimally focused onto said substrate at a reader distance greater than a best focus receive position of said reader.

36. The device of claim 24, wherein said control circuit calculates said delay utilizing a clock.

37. The device of claim 24, wherein said control circuit calculates said delay by monitoring an internal process of said reader.

38. The device of claim 33, wherein control circuit further disables said illumination LED if said delay is equal to or greater than a threshold delay.

39. An indicia decoding device capable of decoding decodable indicia disposed on a substrate, said indicia decoding device comprising:
an imaging assembly having a plural photodetector two dimensional image sensor, optics focusing target indicia onto said plural photodetector two dimensional image sensor, and an imaging axis;
a hand held housing encapsulating said plural photodetector two dimensional image sensor;
at least one laser diode assembly, wherein said laser diode assembly is adapted to project visible laser light onto said substrate in a predetermined pattern; and
a control circuit in communication with said imaging assembly and said illumination assembly, wherein said indicia decoding device has an operating mode in which said control circuit, in response to receipt of a trigger signal:
calculates a delay;
captures at least one frame of image data;
subjects said at least one frame of image data to an indicia decode attempt; and enables said laser diode assembly to project said visible laser light onto said substrate in said predetermined pattern provided that said decode attempt is not successful and a delay threshold has been satisfied, whereby said laser diode assembly is enabled subsequent to receipt of a trigger signal only under difficult reading conditions.

40. The indicia decoding device of claim 39, wherein said control circuit in response to receipt of said trigger signal captures a plurality of frames of image data and subjects each of a plurality of said captured frames of image data to a decode attempt, and wherein said control circuit in response to a receipt of said trigger signal enables said laser diode assembly to project said visible laser light onto said substrate in said predetermined pattern provided that each of said plurality of decode attempts is not successful and said delay threshold has been satisfied.

41. The device of claim 39, wherein said device further includes an LED that projects light at a wavelength different than a wavelength of light emitted by said laser diode assembly.

42. The device of claim 39, further including a prism for redirecting an optical path of a beam emitted by said laser diode assembly.

43. The device of claim 39, wherein said imaging assembly includes a best focus distance of at least five feet.

44. The device of claim 39, wherein said reader includes an optical assembly which splits a beam emitted by said laser diode assembly to project a plurality of spots on a target substrate, said spots being projected substantially along a horizontal centerline of a target.

45. The reader of claim 39, wherein said device further has an LED that projects light onto said substrate.

46. The device of claim 39, wherein said optical reader includes a fixed best focus position.

47. The device of claim 39, wherein said illumination assembly includes a slit aperture and emit optics for imaging said slit aperture onto said substrate, wherein said emit optics are adapted so that said slit aperture is optimally focused onto said substrate at a reader distance greater than a best focus receive position of said reader.

48. The device of claim 39, wherein said control circuit calculates said delay utilizing a clock.

49. The device of claim 39, wherein said control circuit calculates said delay by monitoring an internal process of said reader.

50. The device of claim 45, wherein control circuit further disables said illumination LED if said delay is equal to or greater than a threshold delay.

* * * * *